United States Patent [19]
Kakimi

[11] Patent Number: 5,118,590
[45] Date of Patent: Jun. 2, 1992

[54] LIGHT-SENSITIVE MICROCAPSULE CONTAINING POLYMERIZABLE COMPOUND AND PIGMENT PARTICLES

[75] Inventor: Fujio Kakimi, Kanagawa, Japan

[73] Assignee: Fuji Photo Film Co., Ltd., Kanagawa, Japan

[21] Appl. No.: 564,255

[22] Filed: Aug. 8, 1990

[30] Foreign Application Priority Data

Aug. 9, 1989 [JP] Japan .................. 1-205879

[51] Int. Cl.$^5$ .................. G03C 1/72
[52] U.S. Cl. .................. 430/138; 430/227; 430/255; 264/4; 428/402.2; 428/402.22
[58] Field of Search ............... 430/138, 517, 227, 255; 428/402.2, 402.22; 252/174.13; 264/4

[56] References Cited

U.S. PATENT DOCUMENTS

| | | |
|---|---|---|
| 4,629,676 | 12/1985 | Hayakawa et al. .................. 430/199 |
| 4,851,318 | 7/1989 | Hsieh et al. .................. 430/138 |
| 4,855,209 | 8/1989 | Martin et al. .................. 430/138 |
| 4,885,224 | 12/1989 | Yamamoto et al. .................. 430/138 |
| 4,889,786 | 12/1989 | Takahashi .................. 430/138 |
| 4,910,115 | 3/1990 | Simpson et al. .................. 430/138 |
| 4,952,474 | 8/1990 | Tsukahara et al. .................. 430/138 |
| 4,954,417 | 9/1990 | Nakamura et al. .................. 430/138 |

Primary Examiner—Hoa Van Le
Attorney, Agent, or Firm—Sughrue, Mion, Zinn, Macpeak & Seas

[57] ABSTRACT

A light-sensitive microcapsule contains silver halide, an ethylenically unsaturated polymerizable compound and pigment particles. Another light-sensitive microcapsule contains a photopolymerization initiator, an ethylenically unsaturated polymerizable compound and pigment particles. According to the present invention, the pigment particles are surface treated to be lipophilic. The pigment particles are preferably treated with a surface treating agent such as a lipophilic resin or an oil-soluble surface active agent. The light-sensitive microcapsule is advantageously employed in a light-sensitive material comprising a support and a light-sensitive layer in which the microcapsules are dispersed.

9 Claims, No Drawings

LIGHT-SENSITIVE MICROCAPSULE CONTAINING POLYMERIZABLE COMPOUND AND PIGMENT PARTICLES

FIELD OF THE INVENTION

The present invention relates to a light-sensitive microcapsule which contains silver halide, a polymerizable compound and pigment particles. The invention also relates to a light-sensitive microcapsule which contains a photopolymerization initiator, a polymerizable compound and pigment particles.

BACKGROUND OF THE INVENTION

A light-sensitive microcapsule which contains silver halide, a polymerizable compound and a color image forming substance is disclosed in Japanese Patent Provisional Publications No. 61(1986)-275742, No. 61(1986)-278849, 62(1987)-947 (the contents of these three publications are described in U.S. Pat. No. 4,912,011 and European Patent Provisional Publication No. 0203613A2), No. 62(1987)-169147, No. 62(1987)-209450 (the contents of these two publications are described in U.S. patent application Ser. No. 07/401,604 allowed and European Patent Provisional Publication No. 0224214A2), No. 62(1987)-209438 (corresponding to U.S. Pat. No. 4,888,265 and European Patent Provisional Publication No. 0237024A2) and No. 62(1987)-209439 (corresponding to U.S. Pat. No. 4,833,062 and European Patent Provisional Publication No. 0237025A2). The light-sensitive microcapsule is employed in a light-sensitive material comprising a support and a light-sensitive layer in which the microcapsules are dispersed. The light-sensitive material is used in an image-forming method comprises the steps of imagewise exposing to light the light-sensitive material to form a latent image of silver halide, developing the light-sensitive material to imagewise polymerize the polymerizable compound, and pressing the light-sensitive material on an image-receiving material to imagewise transfer the color image forming substance to the image-receiving material. Thus a color image is formed on the image-receiving material.

A light-sensitive microcapsule which contains a photopolymerization initiator, a polymerizable compound and a color image forming substance is disclosed in Japanese Patent Publications No. 64(1989)-7377 and No. 64(1989)-7378, Japanese Patent Provisional Publications No. 64(1989)-6395 and No. 62(1987)-39845, and U.S. Pat. Nos. 4,399,209, 4,440,846, 4,536,463, and 4,551,407.

The light-sensitive microcapsule is also employed in a light-sensitive material comprising a support and a light-sensitive layer in which the microcapsules are dispersed. The light-sensitive material is used in an image-forming method comprises the steps of imagewise exposing to light the light-sensitive material to imagewise polymerize the polymerizable compound, and pressing the light-sensitive material on an image-receiving material to imagewise transfer the color image forming substance to the image-receiving material. Thus a color image is formed on the image-receiving material.

Examples of the color image forming substance contained in the microcapsule include a colored substance (e.g., pigment) and a non colored or almost non-colored substance (e.g., leuco dye) which forms a color in the presence of a developer. In the above-mentioned image forming methods, a leuco dye has been mainly used as the color image forming substance. However, a dyestuff formed by the reaction between the leuco dye and the developer has a problem in the stability. Therefore, the color image of the leuco dye formed on the image-receiving material tends to fade under the influence of environmental conditions such as light, temperature and humidity.

SUMMARY OF THE INVENTION

The present inventor has attempted to use a pigment which is a stable color image forming substance in place of the leuco dye. However, the inventor notes a serious problem in preparation of microcapsules containing a polymerizable compound and pigment particles.

In preparation of the microcapsules, a colored composition comprising the polymerizable compound and the pigment particles (oil phase) is emulsified in an aqueous medium (water phase) to prepare an O/W emulsion. The shell of the microcapsule is then formed along the O/W interface. The present inventor has found that the pigment particles tend to agglomerate along the O/W interface. The agglomerated pigment particles inhibit the formation of the microcapsule shell. Accordingly, the strength (denseness) of the shell is remarkably decreased. Further, the density of the image is also decreased, since the pigment particles are incorporated into the shell of the microcapsules. Furthermore, an agglomeration of microcapsules is also observed.

An object of the present invention is to provide a light-sensitive microcapsule containing a polymerizable compound and pigment particles which gives an image of high density. Another object of the invention is to provide a light-sensitive microcapsule in which the pigment particles are substantially arranged in the core of the microcapsule.

There is provided by the present invention a light-sensitive microcapsule which contains silver halide, an ethylenically unsaturated polymerizable compound and pigment particles, wherein the pigment particles are surface treated to be lipophilic.

There is also provided by the invention a light-sensitive microcapsule which contains a photopolymerization initiator, an ethylenically unsaturated polymerizable compound and pigment particles, wherein the pigment particles are surface treated to be lipophilic.

The present invention is characterized in that the pigment particles are surface treated to be lipophilic to arrange the particles in the core of the microcapsule.

According to studies of the present inventor, if the pigment particles are surface treated to be lipophilic, the particles are substantially arranged in the core of the microcapsule. Accordingly, the problems caused by the pigment particles arranged in the shell are solved by using the surface treated pigment particles. Therefore, a light-sensitive material employing the light-sensitive microcapsule of the present invention gives an improved clear image of high density.

DETAILED DESCRIPTION OF THE INVENTION

According to the present invention, the pigment particles are surface treated to be lipophilic to arrange the particles in the core of the microcapsule. The pigment particles are preferably treated with a surface treating agent such as a lipophilic resin, a lipophilic polymer, a wax and an oil-soluble surface active agent. The pigment particles can also be surface treated with a reactive material such as an epoxy resin, polyisocyanate, aldehyde resin precondensate and a silane coupling agent to be lipophilic.

The surface-treating (or dispersing) agent for the pigment particles are conventionally known. Examples of the known agents are described in CMC Shuppan (ed.), "Printing Ink Technique (1984)"; CMC Shuppan (ed.), "New Application and Technique of Pigment (1986)"; and Saiwai Shobo (ed.), "Nature and Application of Metallic Soap".

Examples of the resins and polymers used as the surface treating agent for making the pigment lipophilic are described below.

(1) Natural resin

Rosin (e.g., gum rosin, wood rosin and tall oil rosin), shellac, copal, dammar, delsonite and zein (2) Natural resin derivative Cured rosin, lime rosin, zinc-cured rosin, ester gum (rosin+glycerol), rosin-maleic acid resin and ester thereof, rosin-fumaric acid resin and ester thereof, dimeric rosin and polymeric rosin (3) Synthetic resin Phenol resin, rosin-modified phenol resin, xylene resin, urea resin, melamine resin, ketone resin, cumaroneindene resin, petroleum resin, terpene resin, cyclized rubber, chlorinated rubber, alkyd resin, polyamide resin, acryl resin, polyvinyl chloride, vinyl chloride-vinyl acetate copolymer, polyvinyl acetate, polyvinyl alcohol, polyvinyl butyral, chlorinated polypropylene, epoxy resin, polyurethane resin and styrene resin (4) Cellulose derivative Nitrocellulose (NC), acetyl cellulose (AC), cellulose acetate propionate (CAP), cellulose acetate butyrate (CAB), ethyl cellulose and ethylhydroxyethyl cellulose (EHEC)

Waxes can also be employed as the surface treating agent. Examples of wax are described below.

(1) Natural wax

Candelilla wax, carnauba wax, rice wax, wood wax, hohoba oil, bees wax, lanolin, whale wax, montan wax, ozokerite, ceresin, paraffin wax, microcrystalline wax and petrolatum (2) Synthetic wax Fischer tropsch wax, polyethylene wax, modified wax (e.g., montan wax derivative, paraffin wax derivative and microcrystalline wax derivative) and hydrogenated wax (e.g., cured castor oil and derivative thereof, higher aliphatic acid, higher aliphatic acid amide and ester of higher aliphatic acid)

(3) Compounded wax

Examples of oil-soluble surface active agents employable as the surface-treating agent for the pigment particles are described below.

(A) Cationic surface active agent

Octadecylamine acetate, alkyltrimethyl ammonium chloride, polyoxyethyleneoctadecylamine, polyoxyethylenealkyl (beef tallow) amine and high molecular amine (B) Anionic surface active agent Fatty acid soda soap, fatty acid potassium soap, stearic acid soap, alkyl ether sulfate (Na salt), sperm alcohol sulfate (Na salt), lauryl alcohol sulfate (Na salt), sodium dodecylbenzenesulfonate, sodium n-dodecylbenzenesulfonate, sodium alkyl(beef tallow)methyltaurinate, sodium dioctylsulfosuccinate, sodium diethylhexylsulfosuccinate, high-molecular type anion (polycarboxylic acid type), monoglyceryllaurylsulfate (Na salt) and dilaurylphosphonate (Na salt)

(C) Nonionic surface active agent

Polyoxyethylene oleyl ether, polyoxyethylene cetyl ether, polyoxyethylene stearyl ether, polyoxyethylene lauryl ether, polyoxyethylene nonylphenyl ether, polyoxyethylene octylphenol ether, polyoxyethylene monolaurate, polyoxyethylene monostearate, polyoxyethylene monooleate, polyethylene glycol beef tallow acid ester, sorbitan monolaurate, sorbitan monopalmitate, sorbitan monostearate, sorbitan monooleate, sorbitan sesquioleate, sorbitan trioleate, polyoxyethylene sorbitan monolaurate, polyoxyethylene sorbitan monostearate, polyoxyethylene sorbitan monooleate, oxyethylene oxypropylene block polymer, glycerol monostearate and polyoxyethylene distearate (D) Ampholytic surface active agent Dimethylalkyl(coconut)betaine and lecithin (E) Metallic soap Calcium stearate, magnesium stearate, sodium stearate, calcium oleate, magnesium oleate and sodium oleate The other examples of the surface treating agent used in the present invention include:

A combination of trylene diisocyanate and an alcohol (described in Japanese Patent Publication No. 58(1983)-24463);

$R-O-(-CH_2CH_2O-)_{\overline{n}}SO_3 \cdot NH(C_2H_4OH)_3$, wherein R is a $C_6$-$C_{18}$ alkyl group, and n is an integer of 1 to 12 (described in Japanese Patent Publication No. 58(1983)-4067);

A combination of a nonionic active agent and a high-molecular carboxylic acid (described in Japanese Patent Publication No. 59(1984)-1312);

Paratertiarybutylbenzoic acid (described in Japanese Patent Publication No. 51(1976)-45281);

Polyacrylic acid amide (described in Japanese Patent Publication No. 57(1982)-11340);

A nonionic hydrophilic polymer (described in Japanese Patent Provisional Publication No. 53(1978)-26827);

Aqueous polymer latex (described in Japanese Patent Provisional Publication No. 53(1978)-64236);

Polymer latex having carboxyl group (described in Japanese Patent Provisional Publication No. 54(1979)-46229);

Azo dye derivative (described in Japanese Patent Provisional Publication No. 56(1981)-61461);

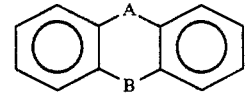

and its derivative, wherein each of A and B independently is —CO—, —NH—, —N=, —S—, —O—, —CH$_2$— or —CH= (described in Japanese Patent Provisional Publication No. 56(1981)-167761);

Polymeric linking compound containing coupling component (described in Japanese Patent Publication No. 58(1983)-8707);

Saponified product of vinyl acetate polymer (described in Japanese Patent Provisional Publication No. 58(1983)-117255);

Polymeric product of aminoacrylate (described in Japanese Patent Provisional Publication No. 58(1983)-215461);

Fatty acid-modified silicone oil (described in Japanese Patent Provisional Publication No. 59(1984)-15455);

Phthalimide (described in Japanese Patent Provisional Publication No. 59(1984)-96175);

A derivative of β-oxynaphthoic acid (described in Japanese Patent Provisional Publication No. 59(1984)-227951);

Diazocomponent containing carboxylic acid (described in Japanese Patent Provisional Publication No. 60(1985)-238638);

Ethylene oxide derivative (described in Japanese Patent Provisional Publication No. 60(1985)-262861);

Carboxyl group-containing polyester (described in Japanese Patent Provisional Publication No. 61(1986)-25630); and A combination of a furan derivative and a polyoxyethylene derivative (described in Japanese Patent Provisional Publication No. 61(1986)-64323).

The surface-treating agents employable in the invention are by no means restricted to the above-exemplified surface-treating agents. The surface-treating agent used in the invention is preferably determined in consideration of the kind and nature of the polymerizable compound and pigment particles. The surface-treating agent can be used singly or in combination. The pigment particles can also be used singly or in combination.

It is preferred to appropriately determine the amount of the surface-treating agent according to the kind and amount of the pigment particles and the polymerizable compound. The amount of the agent is generally in the range of 1 to 100% by weight, preferably 5 to 70% by weight, based on the solid content of the pigment.

The pigment particles can be surface-treated by various conventional processes. For example, the pigment particles are surface treated in the following process (1), (2) or (3).

(1) A process comprising the steps of mixing a solution of a surface-treating agent with the pigment, pulverizing and kneading the mixture according to a milling method, then adding the mixture to the polymerizable compound (optionally after removing the solvent from the mixture), and finally stirring or pulverizing and kneading the resulting mixture;

(2) A process comprising the steps of mixing a solution of a surface-treating agent with the polymerizable compound, adding the pigment to the mixture, and pulverizing and kneading the resulting mixture according to a milling method to gradually remove the solvent from the mixture; or (3) A process comprising the steps of mixing a solution of a surface-treating agent with the pigment, pulverizing and kneading the resulting mixture based on a milling method, removing the solvent from the mixture with suction, then pulverizing the obtained pigment by a dry method, and finally mixing and kneading the pulverized pigment with the polymerizable compound.

Other processes can be also employed. For example, the pigment can be surface treated in preparation of the pigment particles. The surface treatment of the pigment employable in the invention is by no means restricted to the above-described processes.

According to the present invention, the pigment particles are finely and uniformly dispersed in the ethylenically unsaturated polymerizable compound.

The pigments used in the present invention are not only commercially available but also described in various literatures such as "Handbook of Color Index (C.I.)", Nippon Ganryo Gijutsu Kyokai (ed.), "New Handbook of Pigments (1977)", CMC Shuppan (ed.), "New Application and Technique of Dyes (1986)", and CMC Shuppan (ed.), "Printing Ink Technique (1984)".

The pigments can be classified based on the color difference into white pigment, black pigment, yellow pigment, orange pigment, brown pigment, red pigment, violet pigment, blue pigment, green pigment, fluorescent pigment, metallic powder pigment and chromogen bonded polymer. The pigments can also be classified based on the structure difference into insoluble azo pigment, azo lake pigment, condensed azo pigment, chelate azo pigment, phthalocyanine pigment, anthraquinone pigment, pelylene and perynone pigment, thioindigo pigment, quinacridone pigment, dioxadine pigment, isoindolinone pigment, quinophthalone pigment, color lake pigment, azine pigment, nitroso pigment, nitro pigment, natural pigment, fluoroescent pigment and inorganic pigment.

Examples of the pigment are described below.

| Name: | Formula: | Color Index: |
|---|---|---|
| 1. Body Extender Pigment [Inorganic Pigment] | | |
| (1) Baryte | $BaSO_4$ | (C.I.: 77120) |
| (2) Precipitated Barium Sulfate (Blanc Fixe) | $BaSO_4$ | (C.I.: 77120) |
| (3) Barium Carbonate | $BaCO_3$ | (C.I.: 77099) |
| (4) Whiting (Chalk Paris White) | $CaCO_3$ | (C.I.: 77220) |
| (5) Precipitated Calcium Carbonate | $CaCO_3$ | (C.I.: 77220) |
| (6) Gypsum (Light Spar) | $CaSO_4 \cdot 2H_2O$ | (C.I.: 77231) |
| (7) Asbestos | $3MgO \cdot 2SiO_2 \cdot 2H_2O$ | (C.I.: 77718) |
| (8) China Clay (Kaoline, Bentnite or Catalpo) | $Al_2O_3 \cdot 2SiO_2 \cdot 2H_2O$ | (C.I.: 77005) |
| (9) Silica | $SiO_2$ | (C.I.: 77811) |
| (10) Fine Particle Silica (White Carbon) | $SiO_2 \cdot nH_2O$ | |
| (11) Diatomaceous Earth | $SiO_2 \cdot nH_2O$ | (C.I.: 77811) |
| (12) Talc | $3MgO \cdot 4SiO_2 \cdot H_2O$ | (C.I.: 77718) |
| (13) Magnesium Carbonate | $3MgCO_3 \cdot Mg(OH)_2 \cdot 3H_2O \sim MgCO_3 \cdot 3Mg(OH)_2 \cdot 11H_2O$ | (C.I.: 77713) |
| (14) Alumina White | $Al_2O_3 \cdot xH_2O$ or $Al(OH)_3$ | (C.I.: 77002) |
| (15) Gloss White (Alumina-Blanc Fixe) | $Al(OH)_3 + BaSO_4$ | (C.I.: 77120 & 77002) |
| (16) Satin White | $CaSO_4 + Al(OH)_3$ | |
| 2. White Pigment [Inorganic Pigment] | | |
| (21) Zinc Oxide (Zinc White or Chinese White) | $ZnO$ | (C.I.: 77947) |
| (22) Basic Lead Carbonate (Flake White or White Lead) | $2PbCO_3 \cdot Pb(OH)_2$ | (C.I.: 77597) |
| (23) Basic Lead Sulphate (Sublimed White Lead) | $3PbSO_4 \cdot PbO \sim 2PbSO_4 \cdot PbO$ | (C.I.: 77633) |
| (24) Lead Sulphate | $PbSO_4$ | (C.I.: 77630) |
| (25) Lithopone (Orrs's White, Charton White or Enamel White) | $ZnS + BaSO_4$ | (C.I.: 77115) |
| (26) Zinc Sulphide | $ZnS$ | (C.I.: 77975) |
| (27) | | |

-continued

| Name: | Formula: | Color Index: |
|---|---|---|
| Titanium Dioxide (Titanium White) (28) | $TiO_2$ | (C.I.: 77891) |
| Antimon Oxide (Antimony White) | $Sb_2O_3$ | (C.I.: 77052) |
| 3. Black Pigment | | |
| {Inorganic Pigment} (41) | | |
| Carbon Black (Gas Black) (42) | C | (C.I.: 77265) |
| Acetylene Black (43) | C | (C.I.: 77266) |
| Lamp Black (44) | C | (C.I.: 77266) |
| Bone Black (Animal Black or Ivory Black) (45) | C | (C.I.: 77267) |
| Graphite (46) | C | (C.I.: 77265) |
| Black Iron Oxide (47) | $Fe_3O_4$ | (C.I.: 77499) |
| Mineral Black | C | |
| {Azine Pigment} (51) | | |
| Aniline Black (Diamond Black) | [structure: polymeric azine with phenyl, NH, N, $X^-$, and $NH_2$ groups] | (C.I.: 50440) |
| {Phthalocyanine Pigment} (52) | | |
| Cyanine Black BX | | |
| 4. Yellow Pigment | | |
| {Inorganic Pigment} (61) | | |
| Chrome Yellow (62) | $PbCrO_4$ | (C.I.: 77600) |
| Zinc Yellow (63) | $ZnCrO_4$ | (C.I.: 79955) |
| Barium Chromate (Lemon Yellow) (64) | $BaCrO_4$ | (C.I.: 79955) |
| Cadmium Yellow (65) | CdS | (C.I.: 77199) |
| Yellow Oxide of Iron (Mars Yellow or Ferrite Yellow) (66) | $FeO(OH) \cdot nH_2O$ | (C.I.: 77492) |

-continued

| Name: | Formula: | Color Index: |
|---|---|---|
| Ochre (67) | Fe₂O₃, SiO₂ and Al₂O₃ | (C.I.: 77492) |
| Titan Yellow (68) | TiO₂—NiO—Sb₂O₃ | (C.I.: 77610) |
| Lead Cyanamide (69) | Pb(CN)₂ | (C.I.: 77227) |
| Calcium Plumbate {Nitro pigment} (75) | Ca₂PbO₄ | |
| Naphthol Yellow S (Acid Yellow S) | [structure with NO₂, O, and O₃S groups on naphthalene, Ba²⁺] | (C.I.: 10316) |
| {Azo pigment} (76) Hansa Yellow 10G (Monolite Fast Yellow 10G) | [azo structure with NO₂, Cl, CH₃, CO, CH, CO, NH, Cl substituents] | (C.I.: 11710) |
| (77) Hansa Yellow 5G (Lithosol Fast Yellow Y) | [azo structure with NO₂, CH₃, CO, CH, CO, NH substituents] | (C.I.: 11660) |
| (78) | | |

-continued
| Name: | Formula: | Color Index: |
|---|---|---|
| Hansa Yellow 3G (Hansa Yellow GE) (79) | 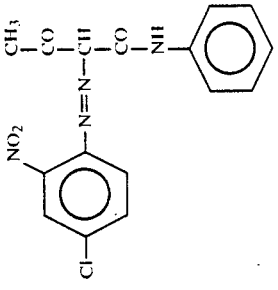 | (C.I.: 11670) |
| Hansa Yellow G (Lithosol Fast Yellow HL) (80) | 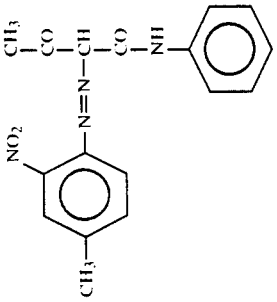 | (C.I.: 11680) |
| Hansa Yellow GR (81) | 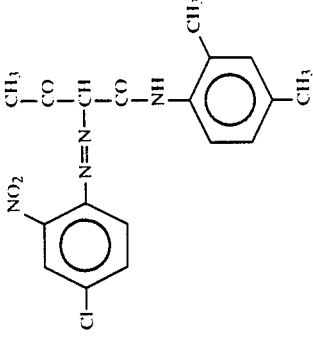 | (C.I.: 11730) |

-continued

| Name: | Formula: | Color Index: |
|---|---|---|
| Hansa Yellow A (82) | structure with $NO_2$, $H_3CO$-phenyl-N=N-C(COCH$_3$)-CONH-phenyl(2,4-di-CH$_3$) | (C.I.: 11735) |
| Hansa Yellow RN (83) | structure with $NO_2$, $H_3CO$-phenyl-N=N-C(COCH$_3$)-CONH-phenyl(2-OCH$_3$) | (C.I.: 11740) |
| Hansa Yellow R (84) | pyrazolone structure with CH$_3$, N-phenyl, and 2,5-dichlorophenyl-N=N group | (C.I.: 12710) |

-continued
| Name: | Formula: | Color Index: |
|---|---|---|
| Pigment Yellow L (Pigment Chrome Yellow L) (85) | 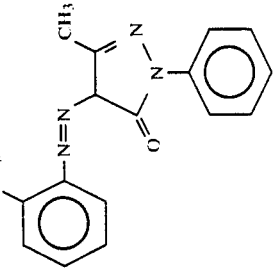 | (C.I.: 12720) |
| Benzidine Yellow (86) | 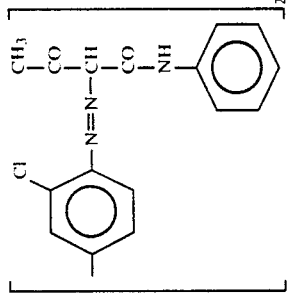 | (C.I.: 21090) |
| Benzidine Yellow G (Vulcan Fast Yellow G) (87) | 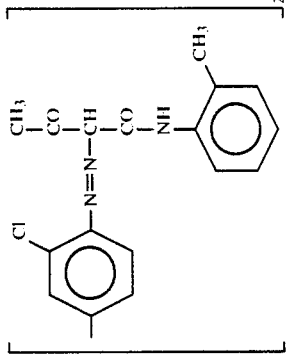 | (C.I.: 21095) |

-continued

| Name: | Formula: | Color Index: |
|---|---|---|
| Benzidine Yellow GR (Vulcan Fast Yellow GR or Permanent Yellow GR) (88) | [structure] | (C.I.: 21100) |
| Permanent Yellow NCG (89) | [structure] | (C.I.: 20040) |

-continued

| Name: | Formula: | Color Index: |
|---|---|---|
| Vulcan Fast Yellow 5G | (structure with OCH₃, Cl, CH₃, N=N-CH(CO-CH₃)-CO-NH-phenyl(CH₃)₂, bracketed ×2) | (C.I.: 21220) |
| (90) Vulcan Fast Yellow R | (structure with CH₃, N=N-CH(CO-CH₃)-CO-NH-phenyl(CH₃), bracketed ×2) | (C.I.: 21135) |
| (91) Tartrazine Lake {Acidic Lake} (92) | (pyrazolone structure with COO(Na), N=N-phenyl, N-phenyl-SO₃(Na)) | (C.I.: 19130) |

-continued

| Name: | Formula: | Color Index: |
|---|---|---|
| Quinoline Yellow Lake {Vat Color Pigment} (93) | [structure with 2SO₃, Ba²⁺] | (C.I.: 47005) |
| Anthragen Yellow 6GL {Azo Pigment} (94) | [anthraquinone structure with NHOC-phenyl-OH] | (C.I.: 60520) |
| Permanent Yellow FGL (Sulfamide Azo Yellow) (95) | [azo structure with OCH₃, NHSO₂-phenyl, H₃CO, N=N, CH₃-CO-CH-CO-NH, OCH₃, Cl, H₃CO] | |

-continued

| Name: | Formula: | Color Index: |
|---|---|---|
| Permanent Yellow H10G (Light Fast Benzidine Yellow) (96) | [structure: bis-azo compound with 2,5-dichlorophenyl and 2,4-dimethylphenyl groups linked via CH₃-CO-CH-CO-NH] | |
| Permanent Yellow HR (Benzidine Yellow Reddish) {Vat Color Pigment} (97) | [structure: bis-azo compound with p-tolyl and 2-methoxy-4-chloro-5-methoxyphenyl groups linked via CH₃-CO-CH-CO-NH] | |
| Anthrapyrimidine Yellow (Indanthrene Yellow 4GF) {Isoindolinon Pigment} (98) | | |
| Isoindolinon Pigment {Azo Dye} (99) | [structure: bis(tetrachlorophthalimide) linked by N=R-N with NH groups] | (C.I.: 68420) |

-continued

| Name: | Formula: | Color Index: |
|---|---|---|
| Cromophtal Yellow (100) | [structure: bis-azo compound with NHCO-tolyl, phenyl ring, N=N, CH(COCH₃)(CONH-phenyl)]₂ | |
| Jisazo Yellow (AAA) (101) | | (C.I.: 21090) |
| Jisazo Yellow (AAMX) (102) | | (C.I.: 21100) |
| Jisazo Yellow (AAOT) (103) | | (C.I.: 21105) |
| 5. Orange Pigment {Inorganic Pigment} | | |
| Chrome Orange (111) | PbCrO₄·PbO | (C.I.: 77601) |
| Chrome Vermillion (Molybdate Orange or Molybdate Red) (112) | PbCrO₄·PbMoO₄·PbSO₄ | (C.I.: 77605) |
| {Azo Pigment} | | |
| Sudan I (Fat Orange R or Oil Orange) (115) | [structure: 2-naphthol with phenylazo group at 1-position] | (C.I.: 12055) |
| (116) | | |

-continued

| Name: | Formula: | Color Index: |
|---|---|---|
| (116) Permanent Orange (Dinitroaniline Orange, Permanent Red GG or Hansa Orange RN) | 2-hydroxynaphthalene coupled via azo linkage to 2-nitro-4-nitrophenyl | (C.I.: 12075) |
| (117) Lithol Fast Orange 3GL (Lake Fast Orange 4RL) | 2-hydroxynaphthalene coupled via azo linkage to 2-nitro-4-trifluoromethylphenyl | (C.I.: 12125) |
| (118) Permanent Orange GTR | 3-(phenylcarbamoyl)-2-hydroxynaphthalene coupled via azo linkage to 3-chlorophenyl | (C.I.: 12305) |
| (119) Hansa Yellow 3R (Monolite Fast Orange 3G) | 2-methylphenyl-NH-CO-CH(-N=N-(2-nitro-4-methoxyphenyl))-CO-CH$_3$ | (C.I.: 11725) |

-continued

| Name: | Formula: | Color Index: |
|---|---|---|
| (120) Vulcan Fast Orange GG (Benzidine Orange 2G) | ![structure] | (C.I.: 21165) |
| (121) Benzidine Orange G (Permanent Orange G, Vulcan Fast Orange G or PV Orange G) | ![structure] | (C.I.: 21110) |
| (122) Persian Orange (Orange II Lake) | ![structure] | (C.I.: 15510) |
| {Vat Color Pigment} (123) | | |

-continued

| Name: | Formula: | Color Index: |
|---|---|---|
| Indanthren Brilliant Orange GK (124) | (structure: anthanthrone with Cl₂, bracketed ×2) | (C.I.: 59305) |
| Indanthren Brilliant Orange RK (125) | (structure: dibromoanthanthrone with Br substituents) | (C.I.: 59105) |
| Indanthrene Brilliant Orange GR | (structure: naphthalene bis-benzimidazole, Trans-form) | (C.I.: 71105) |
| 6. Brown Pigment {Inorganic Pigment} (141) | | |
| Iron Oxide (142) | Fe₂O₃ + FeO | (C.I.: 77491) |
| Umber (147) {Azo Pigment} | Fe₂O₃ + MnO₂ + Mn₃O₄ | (C.I.: 77491) |

-continued

| Name: | Formula: | Color Index: |
|---|---|---|
| Permanent Brown FG | [structure: naphthalene with OH, CONH linked to dimethoxyphenyl, and azo group to dichlorophenyl] | (C.I.: 12480) |
| (148) | | |
| Para Brown (Irgalite Brown) | [structure: naphthol azo nitrophenyl] (Copper Complex Salt) | (C.I.: 12071) |
| 7. Red Pigment {Inorganic Pigment} | | |
| (151) Red Iron Oxide (Rouge) | $Fe_2O_3$ | (C.I.: 77491) |
| (152) Red Lead (Plumbo-Plumbic Oxide or Minium) | $Pb_3O_4$ | (C.I.: 77578) |
| (153) Vermilion (Red Mercury Sulphide) | $HgS$ | (C.I.: 77766) |
| (154) Cadmium Red (Selenium Red) | $CdS + CdSe$ | (C.I.: 77202) |
| (155) Cadmium Mercury Red | $CdS + HgS$ | (C.I.: 77060) |
| (156) Antimony Vermilion (Antimony Orange) {Azo Pigment} | $2Sb_2S_3 \cdot Sb_2O_3$ or $Sb_2S_3 \cdot Sb_2O_3$ | |
| (161) | | |

-continued

| Name: | Formula: | Color Index: |
|---|---|---|
| Permanent Red 4R (Toluidine Red, Lake Red 4R, Hansa Scarlet RGN, RN, RNC, Hansa Red B or Helio Red Toner RL) | H₃C—⟨benzene⟩—N=N—⟨naphthalene-OH⟩ with NO₂ | (C.I.: 12120) |
| (162) Para Red (Pigment Red B or Para Nitraniline Red) | O₂N—⟨benzene⟩—N=N—⟨naphthalene-OH⟩ | (C.I.: 12070) |
| (163) Fire Red (Nitro Chloraniline Red, Chlorinated Para Red or Permanent Red R) | O₂N—⟨benzene-Cl⟩—N=N—⟨naphthalene-OH⟩ | (C.I.: 12085) |
| (164) p-Chlor-o-nitroaniline Red (Parachlor Red) | Cl—⟨benzene-NO₂⟩—N=N—⟨naphthalene-OH⟩ | (C.I.: 12090) |
| (165) | | |

-continued

| Name: | Formula: | Color Index: |
|---|---|---|
| Lithol Fast Scarlet G | (structure) | |
| (166) | | |
| Brilliant Fast Scarlet | (structure) | (C.I.: 12315) |
| (168) | | |
| Brilliant Carmine BS | (structure) | |
| (169) | | |

-continued

| Name: | Formula: | Color Index: |
|---|---|---|
| Permanent Red F2R (Monolite Fast Red 2R, 2RV) (170) | structure | (C.I.: 12310) |
| Permanent Red F4R (Monolite Red 4R) (171) | structure | (C.I.: 12335) |
| Permanent Red FRL (Pigment Red FRL) (172) | structure | (C.I.: 12440) |

-continued

| Name: | Formula: | Color Index: |
|---|---|---|
| Permanent Red FRLL (Monolite Fast Red LF) (173) | (structure: 2,5-dichlorophenyl-azo-2-hydroxy-3-naphthoic acid 2-methoxyanilide) | (C.I.: 12460) |
| Permanent Red F4RH (Monolite Red 4RH) (174) | (structure: 4-chloro-2-methylphenyl-azo-2-hydroxy-3-naphthoic acid 4-chloro-2-methylanilide) | (C.I.: 12420) |
| Fast Scarlet VD (175) | (structure: 4-chloro-2-trifluoromethylphenyl-azo-2-hydroxy-3-naphthoic acid anilide) | |

-continued

| Name: | Formula: | Color Index: |
|---|---|---|
| Vulcan Fast Rubine B | (structure) | (C.I.: 12320) |
| (176) | | |
| Vulcan Fast Pink G | (structure) | (C.I.: 12330) |
| (177) | | |
| Light Fast Red Toner B (Lithol Fast Red Toner B) | (structure) | (C.I.: 12450) |
| (178) | | |

-continued

| Name: | Formula: | Color Index: |
|---|---|---|
| (179) Light Fast Red Toner R (Lithol Fast Red Toner R) | [structure with naphthol, azo, CONH-dimethylphenyl, and benzylsulfonyl-methoxyphenyl groups] | (C.I.: 12455) |
| (180) Permanent Carmine FB | [structure with naphthol, azo, CONH-(methoxy,chloro,methoxy)phenyl, and diethylsulfamoyl-methoxyphenyl groups] | (C.I.: 12490) |
| (181) Pyrazolone Red (Vulcan Fast Red B) | [bis-pyrazolone azo structure with COOC$_2$H$_5$, phenyl, and chloro-methylphenyl groups]$_2$ | (C.I.: 21120) |

-continued
| Name: | Formula: | Color Index: |
|---|---|---|
| Lithol Red (Lithol Red R) | 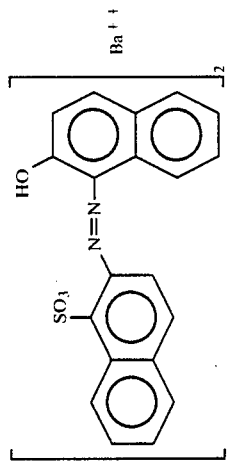 (Ba may be replaced with Na, Ca, Sr, Mn or Fe) | (C.I.: 15630) |
| (182) | | |
| Lake Red C (C-Red) | 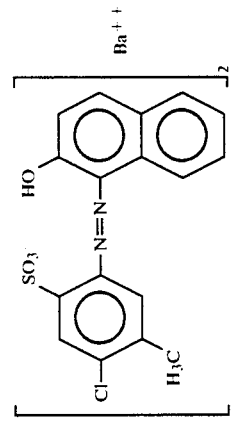 | (C.I.: 15585) |
| (183) | | |
| Lake Red D | 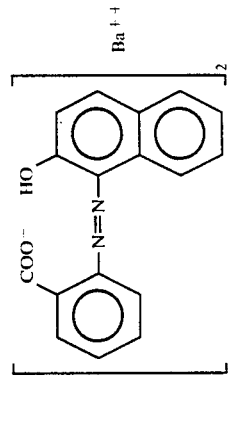 | (C.I.: 15500) |
| (184) | | |

-continued

| Name: | Formula: | Color Index: |
|---|---|---|
| Anthosine B Lake (Vulcanosin Red B) | [structure with NHCO-dichlorophenyl, OH, N=N-chlorophenyl, Ba-SO₃] | (C.I.: 18030) |
| (185) Brilliant Scarlet G | [naphthol structure with COO⁻, HO, N=N-phenyl, Ca²⁺]₂ | (C.I.: 15800) |
| (186) Lithol Rubine GK (Hansa Rubine G) | [naphthol structure with COO⁻, HO, N=N-(chloro, sulfo)phenyl, Ca²⁺] | (C.I.: 15825) |
| (187) Permanent Red F5R (Watchung Red, Lithol Rubine F5R, Permanent Red 2B or Tinting Red) | [naphthol structure with COO⁻, HO, N=N-(methyl, chloro, sulfo)phenyl, Ca²⁺] | (C.I.: 15865) |

-continued
| Name: | Formula: | Color Index: |
|---|---|---|
| (188) Brilliant Carmine 6B (Lithol Rubine BK or Permanent Red F6R) | 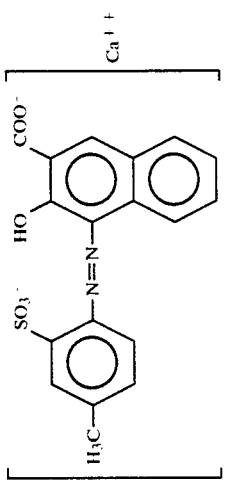 | (C.I.: 15850) |
| (189) Pigment Scarlet 3B | 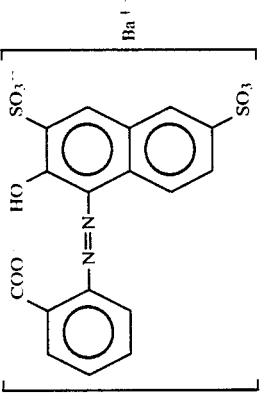 | (C.I.: 16105) |
| (190) Bordeaux 5B (Autol Red RLP) | 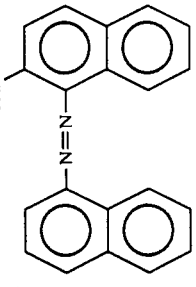 | (C.I.: 12170) |
| (191) | | |

-continued

| Name: | Formula: | Color Index: |
|---|---|---|
| Toluidine Maroon (192) | structure | (C.I.: 12350) |
| Permanent Bordeaux F2R (Monolite Fast Bordeaux 2R) (193) | structure | (C.I.: 12385) |
| Helio Bordeaux BL (Vulcan Bordeaux BL or Monolite Bordeaux BL) (194) | structure | (C.I.: 14830) |

-continued

| Name: | Formula: | Color Index: |
|---|---|---|
| Bordeaux 10B (Bordeaux Lake 10B or Lithol Bordeaux Toner R) (195) | [structure with HO, COO⁻, SO₃⁻, N=N] Ca²⁺ | (C.I.: 15880) |
| BON Maroon Light (196) | [structure with HO, COO⁻, ⁻O₃S, Cl, N=N] Mn²⁺ | (C.I.: 15825) |
| BON Maroon Medium (Maroon Toner BB or BON Maroon Dark) (197) | [structure with HO, COO⁻, SO₃⁻, N=N] Mn²⁺ | (C.I.: 15880) |

{Acidic Lake}

-continued
| Name: | Formula: | Color Index: |
|---|---|---|
| Eosine Lake | 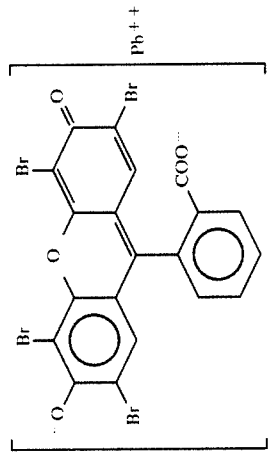 | (C.I.: 45380) |
| {Basic Lake}<br>(198)<br>Rhodamine Lake B | 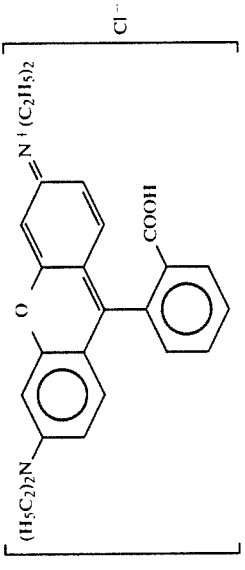 | (C.I.: 45170) |
| (199)<br>Rhodamine Lake Y | 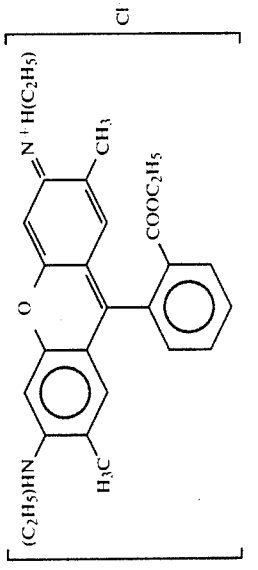 | (C.I.: 45160) |
| {Mordant Pigment}<br>(200)<br>Alizarine Lake (Madder Lake) | 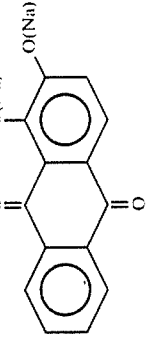 | (C.I.: 58000) |

-continued
| Name: | Formula: | Color Index: |
|---|---|---|
| {Vat Color Pigment} (201) Thioindigo Red B | 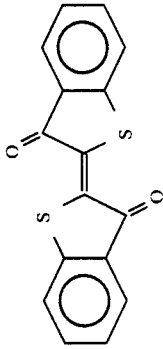 | (C.I.: 73300) |
| (202) Thioindigo Maroon (Indanthrene Red Violet RH, PV Violet R or Durindone Red 3B) | 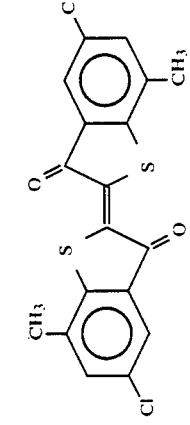 | (C.I.: 73385) |
| {Azo Pigment} (203) Permanent Red FGR | 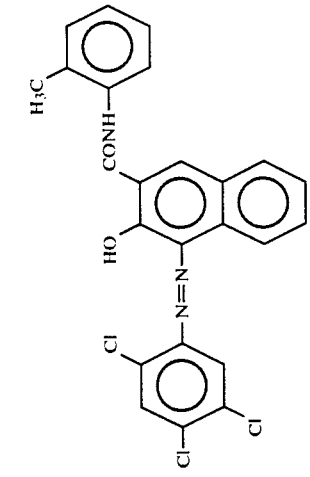 | (C.I.: 12370) |
| (204) PV Carmine HR | 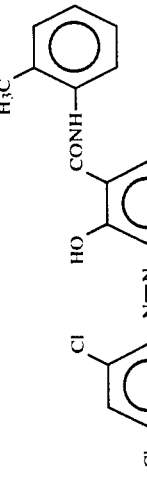 | |
| (205) | | |

-continued

| Name: | Formula: | Color Index: |
|---|---|---|
| Watchung Red Mn (Bon Red Light or Bon Red Dark) | [structure with Mn²⁺] (Mn may be replaced with Sr, Ca or Ba) | |
| (206) Cromophtal Red Type 1 | [structure] | |
| (207) Cromophtal Red Type 2 | [structure] | |
| {Vat Color Pigment} (208) | | |

-continued

| Name: | Formula: | Color Index: |
|---|---|---|
| Cromophtal Bordeaux R (Vat Red Violet MR) | | |
| (209) Monolite Fast Red YS | | (C.I.: 59300) |
| (210) Perylene Red (Indanthrene Scarlet R) | | (C.I.: 71140) |
| (211) Permanent Red BL (Perylene Scarlet) | | |
| {Quinacridone Pigment} (212) | | |

-continued
| Name: | Formula: | Color Index: |
|---|---|---|
| Cinquasia Red Y | 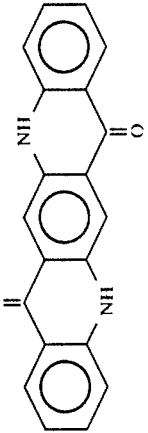 (γ type, ≦1μ) | (C.I.: 46500) |
| (213) Cinquasia Red B (Permanent Red E5B) | (γ type, ≧1μ) | (C.I.: 46500) |
| (214) Cinquasia Violet R | (β type) | (C.I.: 46500) |
| (215) Permanent Pink E (Quindo Magenta RV 6803) | 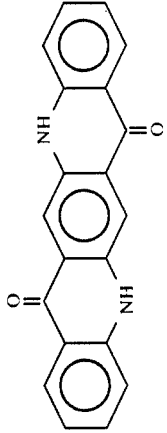 | |
| (216) Rhodamine 6G Lake | | |
| (217) Quinacridone Magenta | | |
| 8. Violet Pigment {Inorganic Pigment} | | |
| (221) Cobalt Violet Deep | Co₃(PO₄)₂ or Co₃(PO₄)₂·8H₂O | (C.I.: 77360) |
| (222) | | |

-continued

| Name: | Formula: | Color Index: |
|---|---|---|
| Cobalt Violet Light<br>(223) | Co₃(AsO₄)₂ or Co₃(AsO₄)₂·8H₂O | (C.I.: 77350) |
| Manganese Violet (Neuremberg Violet or Mineral Violet)<br>{Azo Pigment}<br>(231) | Mn₂(PO₄)₃ or (NH₄)₂Mn(P₂O₇)₂ | (C.I.: 77742) |
| Fast Violet B | ![structure with naphthalene bearing OH, CONH-phenyl, N=N linked to phenyl with OCH₃, CH₃ and CONH-phenyl groups] | |
| {Basic Lake}<br>(232)<br>Methyl Violet Lake | ![triphenylmethane dye structure with N(CH₃)₂, N(C₂H₅)₂ and =NHCH₃ groups] | |

-continued
| Name: | Formula: | Color Index: |
|---|---|---|
| | 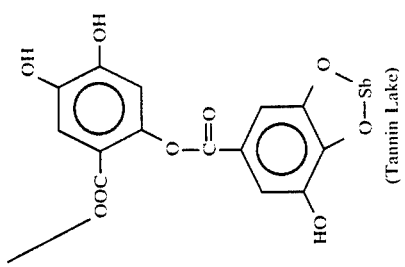 (Tannin Lake) | |
| {Vat Color Pigment} (233) | 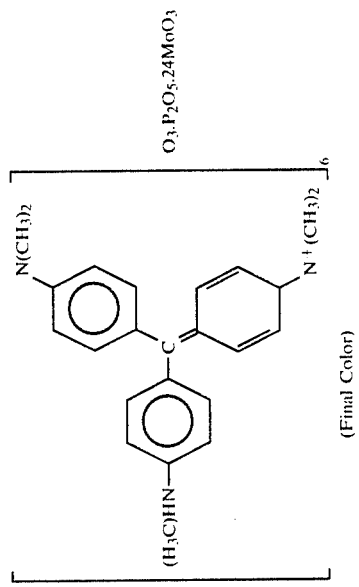 (Final Color) | (C.I.: 42535) |

-continued

| Name: | Formula: | Color Index: |
|---|---|---|
| Indanthrene Brilliant Violet RR | 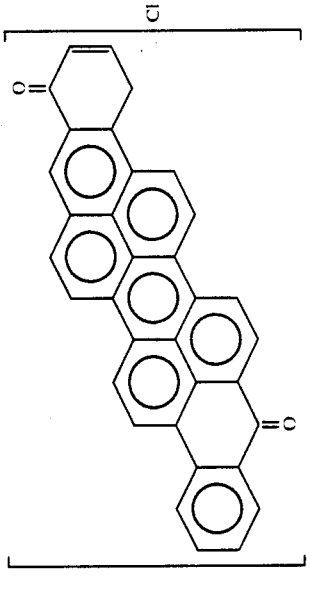 | (C.I.: 60010) |
| (234) Dioxazine Violet (PV Fast Violet BL) | 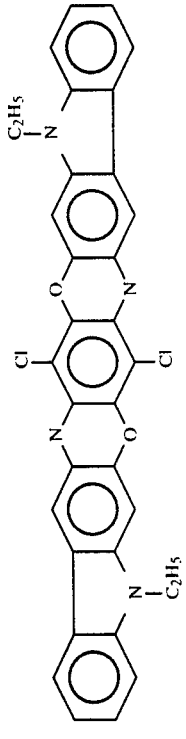 | |
| (235) Isoviolanthron Violet | | |
| 9. Blue Pigment {Inorganic Pigment} | | |
| (251) Ultramarine | $3NaAl.SiO_4.Na_2S_2$ or $2(Na_2O.Al_2O_3.2Si(O_2).Na_2S_2$ | (C.I.: 77007) |
| (252) Prussian Blue (Milori Blue, Iron Blue or Berlin Blue) | $Fe_4[Fe(CN)_6]_3.nH_2O$ | (C.I.: 77510 & 77520) |
| (253) Cobalt Blue (Thenard's Blue) | $CoO.nAl_2O_3$ (n = 2~3) | (C.I.: 77346) |
| (254) Cerulean Blue | $CoO.nSnO_2.mMgO$ (n = 1.5~3.5, m = 2~6) | (C.I.: 77368) |
| (255) Asbolite (Zaffer) {Acidic Lake} | $Co_3O_4 + SiO_2 + Al_2O_3 + Fe_2O_3 + NiO + MnO$ | |
| (261) | | |

| Name: | Formula: | Color Index: |
|---|---|---|
| Alkali Blue Lake | 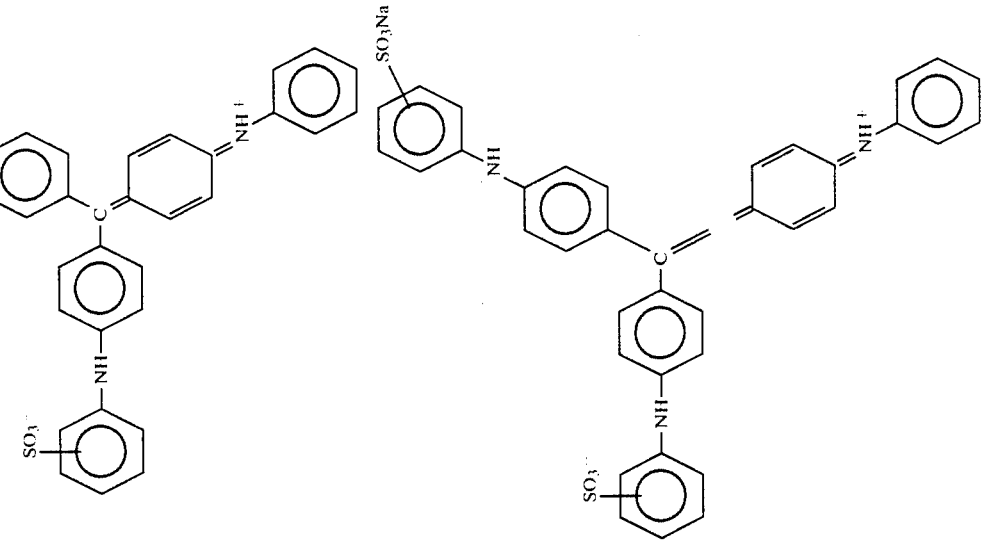 (C.I.: 42750A or 42770A) | |
(262)

-continued
| Name: | Formula: | Color Index: |
|---|---|---|
| Peacock Blue Lake<br><br>{Basic Lake}<br><br>(263) | 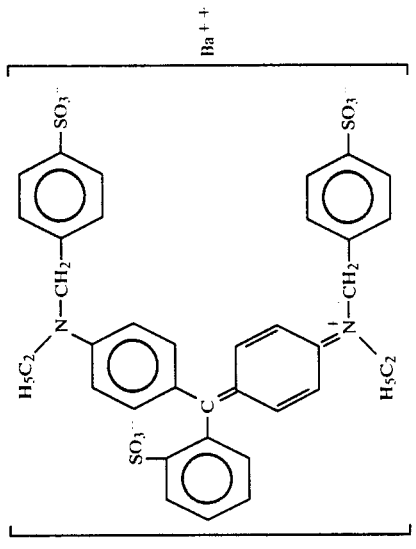 | (C.I.: 42090) |
| Peacock Blue Lake (Final Color)<br><br>(264) | 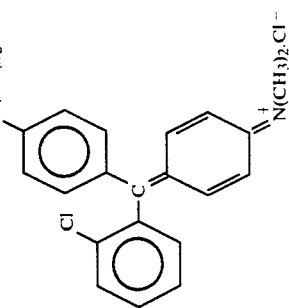 | (C.I.: 42025) |

| Name: | Formula: | Color Index: |
|---|---|---|
| Victoria blue Lake (Final Color) | 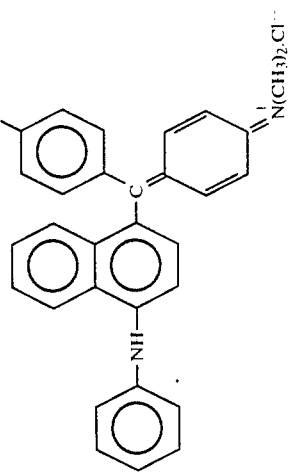 | (C.I.: 44045) |
| {Phthalocyanine Pigment}<br>(265)<br>Phthalocyanine Blue G<br>(Heliogen Blue G or Monastral Fast Blue G) | 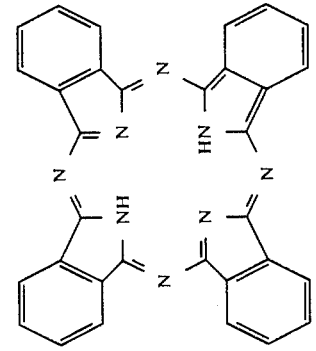 | (C.I.: 74100) |
| (266)<br>Phthalocyanine Blue (Copper Phthalocyanine, Heliogen Blue B, Monastral Blue B or Cyan Blue) | 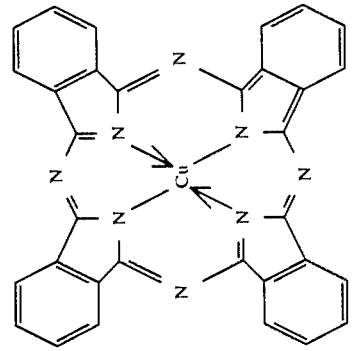 | (C.I.: 74160) |

-continued

| Name: | Formula: | Color Index: |
|---|---|---|
| (267) Fast Sky Blue (Sulphonated Copper Phthalocyanine) [wherein hydrogen atoms of the four benzene rings are replaced with (about two) sulfo groups and are in the form of Ba salt] {Vat Color Pigment} | Copper Phthalocyanine | (C.I.: 74180) |
| (268) Indanthrene Blue RS | 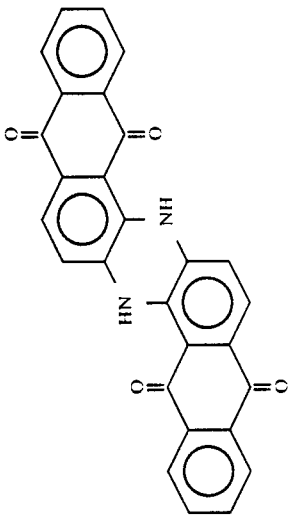 | (C.I.: 69800) |
| (269) Indanthrene Blue BC (Indanthrene Blue) | 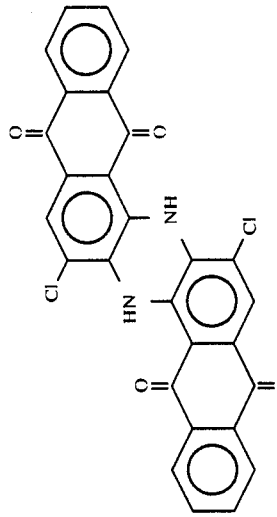 | (C.I.: 69825) |
| (270) Indigo | 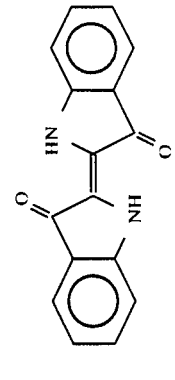 | (C.I.: 73000) |
| 10. Green Pigment {Inorganic Pigment} (281) Chrome Green (Brunswick Green) | Mixture of Prussian Blue and Chrome Yellow | (C.I.: 77520 + 77600) |

-continued

| Name: | Formula: | Color Index: |
|---|---|---|
| (282) Zinc Green | Mixture of Zinc Yellow and Prussian Blue | (C.I.: 77335) |
| (283) Chromium Oxide Green | $Cr_2O_3$ | (C.I.: 77288) |
| (284) Veridian (Guignet's Green or Hydrated Chromium Oxide) | $Cr_2O(OH)_4$ | (C.I.: 77289) |
| (285) Emerald Green (Paris Green or Schweinfurt Green) | $Cu(CH_3CO_2)_2 \cdot 3CuO(AsO_2)_2$ | (C.I.: 77410) |
| (286) Cobalt Green (Rinman's Green) {Nitroso Pigment} | $CoO-ZnO-MgO$ | |
| (291) Pigment Green B (Naphthol Green Y) | 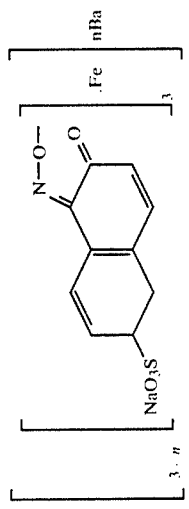 | (C.I.: 10006) |
| (292) Naphthol Green B | 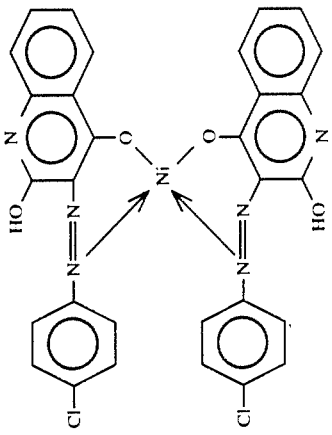 | (C.I.: 10020) |
| {Azo Pigment} (293) Green Gold (Lithol Fast Yellow 3GD) | | (C.I.: 12775) |
| {Acidic Lake} | | |

-continued

| Name: | Formula: | Color Index: |
|---|---|---|
| (294)<br>Acid Green Lake | 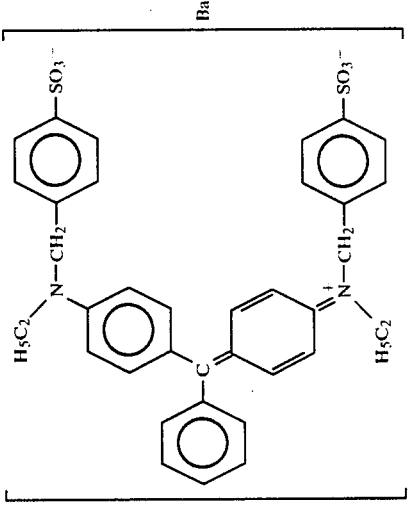 | (C.I.: 42000) |
| {Basic Lake}<br>(295)<br>Malachite Green Lake | 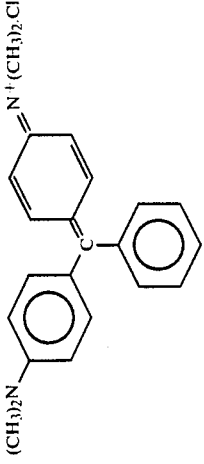 | |
| {Phthalocyanine Pigment}<br>(296)<br>Phthalocyanine Green<br>(Chlorinated Copper Phthlocyanine or Heliogen Green G)<br>[wherein chlorine is introduced into the benzene rings]<br>(299)<br>Poly-Cl—Br—Cu-Phthalocyanine (Monastarl Fast Green 6YS) | Copper Phthalocyanine<br><br>Hexabromo-decachloro-Cu-phthalocyanine | (C.I.: 74260)<br><br>(C.I.: 74265) |
| 11. Fluorescent Pigment<br>{Inorganic Pigment}<br>(311)<br>Zinc Sulphide<br>(312)<br>Zinc Silicate<br>(313)<br>Zinc Cadmium Suphide<br>(314) | $ZnS$<br>$Zn_2SiO_4$<br>$(Zn, Cd)S$ | (C.I.: 77975) |

-continued

| Name: | Formula: | Color Index: |
|---|---|---|
| Calcium Sulphide (315) | CaS | (C.I.: 77245) |
| Strontium Sulphide (316) | SrS | (C.I.: 77847) |
| Calcium Tangstate {Daylight Fluorescent Pigment} (321) | CaWO₄ | (C.I.: 77250) |
| Fluorescent Pigment | P.B.FIAT 1313 III CIOS XXVII-84 | |
| 12. Metallic powder pigment | | |
| (331) Aluminium Powder (Aluminium Flake or Aluminium Bronze) | Al | (C.I.: 77000) |
| (332) Bronze Powder | Cu + Zn + Al | |
| (333) Copper Powder | Cu | (C.I.: 77400) |
| (334) Tin Powder (Tin Flake) | Sn | (C.I.: 77860) |
| (335) Lead Powder | Pb | (C.I.: 77575) |
| (336) Zinc Dust | Zn | (C.I.: 77945) |
| 13. Other | | |
| Chromogen Bonded Polymer | | |

The diameter of the pigment particles is preferably in the range of 0.01 to 10 μm, more preferably 0.05 to 1 μm, in the measurement after the particles are dispersed in the polymerizable compound.

The pigment is preferably used in an amount of 5 to 120 weight parts, more preferably 10 to 60 weight parts, based on 100 weight parts of the polymerizable compound.

Other components used in the light-sensitive microcapsule of the present invention and a light-sensitive material using the microcapsule are described hereinafter.

The light-sensitive microcapsule of the invention includes two embodiments. The first embodiment of the microcapsule contains silver halide, an ethylenically unsaturated polymerizable compound and the pigment particles. The second embodiment of the microcapsule contains a photopolymerization initiator, an ethylenically unsaturated polymerizable compound and the pigment particles.

The light-sensitive material using the microcapsule also include two embodiments. The light-sensitive material of the first embodiment comprises a support and a light-sensitive layer provided thereon which contains silver halide, a reducing agent, an ethylenically unsaturated polymerizable compound and the pigment particles. The silver halide, the polymerizable compound and the pigment particles are contained in the light-sensitive microcapsules which are dispersed in the light-sensitive layer. The reducing agent is preferably contained in the microcapsules thought it may be arranged outside of the microcapsules. The light-sensitive material of the second embodiment comprises a support and a light-sensitive layer provided thereon which contains a photopolymerization initiator, an ethylenically unsaturated polymerizable compound and the pigment particles. The photopolymerization initiator, the polymerizable compound and the pigment particles are contained in the light-sensitive microcapsules which are dispersed in the light-sensitive layer.

First, the main components of the first embodiment such as silver halide, the reducing agent and the ethylenically unsaturated polymerizable compound are described below in detail.

Examples of the silver halide employable for the light-sensitive material include silver chloride, silver bromide, silver iodide, silver chlorobromide, silver chloroiodide, silver iodobromide and silver chloroiodobromide in the form of grains.

As for the crystal structure of the silver halide grains, the individual grains may have a homogeneous halogen composition or a heterogeneous halogen composition in which the composition varies from the outer surface portion to the inside portion, or may be a multi-layer structure. Otherwise, the silver halide grains may be bonded with other silver halide grains having different halogen composition through epitaxial bonding, or may be bonded with compounds other than the silver halide such as silver rhodanate and lead oxide.

The silver halide grains may be of various crystal forms, for example, a regular crystal form such as hexahedron, octahedron or tetradecahedron, an irregular form such as spherical form or tubular form, a form having crystalline defect such as a twinning plane, and a mixed form thereof.

The silver halide grains may be extremely small sized grains having a grain diameter of not more than approx. 0.01μ, or may be relatively large sized grains having a grain diameter of projected area up to about 10 μm. The silver halide emulsion may be a polydispersed emulsion or a monodispersed emulsion.

Also preferred is a monodispersed emulsion, which is described, for example, in U.S. Pat. Nos. 3,574,628 and 3,655,394 and U.K. Patent No. 1,413,748.

Two or more kinds of silver halide grains which differ in halogen composition, crystal habit, grain size and/or other features from each other can be employed in combination.

It is preferred to use silver halide grains having a relatively low fogging value.

The silver halide photographic emulsions employable in the light-sensitive material of the invention can be prepared by processes described, for example, in Research Disclosure (RD), No. 17,643, pp. 22–23 (Dec. 1978), (Emulsion preparation and types) and No. 18,716, p. 648, (Nov. 1979); P. Glafkides, "Chemie et phisique photographique (Paul Montel, 1967)"; G. F. Duffin, "Photographic Emulsion Chemistry (Focal Press, 1966)"; and V. L. Zelikman et al., "Making and Coating Photographic Emulsion (Focal Press, 1964)".

A tubular grain having an aspect ratio of not less than about 5 can be also employed. The tubular silver halide grains can be easily prepared by processes described in Gutoff, "Photographic Science and Engineering, Vol. 14, pp. 248–257 (1970)"; U.S. Pat. Nos. 4,434,226, 4,414,310, 4,433,048 and 4,439,520 and U.K. Patent No. 2,112,157.

The silver halide emulsion is generally used after subjecting it to physical ripening, chemical ripening and spectral sensitization. Various additives employable in those stages are described in Research Disclosure, No. 17,643 and No. 18,716. The relevant parts in the literature are described below in the form of a table.

Conventional photographic additives employable in the invention are also described in the above-mentioned Research Disclosure, and the relevant parts in the literature are also shown in the following table.

|    | Additives | RD 17,643 | RD 18,716 |
|----|-----------|-----------|-----------|
| 1. | Chemical sensitizing agent | p. 23 | p. 648 (right side) |
| 2. | Sensitivity-increasing agent |  | p. 648 (right side) |
| 3. | Spectral sensitizing agent | p. 23–24 | p. 648- (right side) |
|    | Supersensitizing agent |  | p. 649 (right side) |
| 4. | Antifogging agent and stabilizer | p. 24–25 | p. 649- (right side) |

A water-soluble vinyl polymer can be adsorbed on the silver halide grains. A light-sensitive material using a water-soluble vinyl polymer is described in Japanese Patent Provisional Publication No. 63(1988)-91652.

The amount of the silver halide contained in the light-sensitive layer preferably is in the range of 0.1 mg/m$^2$ to 10 g/m$^2$ in terms of silver contained in the silver halide and the later-described organic silver salt which is one of optional components. The amount of the silver halide contained in the light-sensitive layer preferably is not more than 1 g/m$^2$, more preferably in the range of 1 to 500 mg/m$^2$, in terms of silver contained in the silver halide only.

For uniformly incorporating the silver halide into microcapsules, a copolymer composed of a hydrophilic repeating unit and a hydrophobic repeating unit is preferably dissolved in the polymerizable compound.

The reducing agent employable in the light-sensitive material has a function of reducing the silver halide and/or a function of accelerating (or restraining) polymerization of the polymerizable compound. There are known various reducing agents having the above-mentioned functions. Examples of such reducing agents include hydroquinones, catechols, p-aminophenols, p-phenylenediamines, 3-pyrazolidones, 3--aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

By adjusting the nature or amount of the above reducing agent, the polymerization reaction of the polymerizable compound can be accelerated or restrained within the area where a latent image of the silver halide has been formed. In a system wherein the polymerization of the polymerizable compound is restrained or inhibited within the area where a latent image of the silver halide has been formed, 1-phenyl-3-pyrazolidones, hydroquinones and sulfonamidephenols are particularly preferred as the reducing agent. In a system wherein the polymerization of the polymerizable compound is accelerated within the area where a latent image of the silver halide has been formed, a hydrazine derivative is particularly preferred as the reducing agent.

Various reducing agents having the above-mentioned functions (including compounds referred to as a developing agent or a hydrazine derivative) are described in U.S. Pat. Nos. 4,859,568, 4,735,884 and 4,772,531, and European Patent Provisional Publication No. 0202490A2, No. 0219087A2 and No. 0235751A2. These reducing agents are also described in T. James, "The Theory of the Photographic Process", 4th edition, pp. 291-334 (1977), Research Disclosure Vol. 170, No. 17029, pp. 9-15 (June 1978), and Research Disclosure Vol. 176, No. 17643, pp. 22-31 (December 1978). Further, the reducing agent can be in the form of a precursor capable of releasing a reducing agent under heating or in contact with a base. Also in the light-sensitive material of the invention, various reducing agents and reducing agent precursors described in the above publications can be effectively employed.

A basic reducing agent, which may form a salt with an acid, can be used in the form of a salt with an appropriate acid.

The reducing agents can be used singly or in combination. In the case that two or more reducing agents are used in combination, certain interactions between the reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Concrete examples of the above-mentioned reducing agents are as follows.

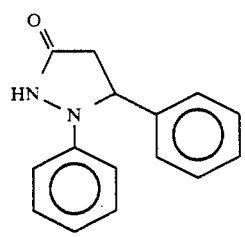

(1)

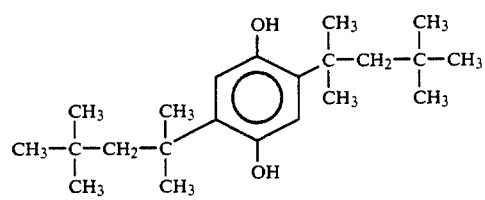

(2)

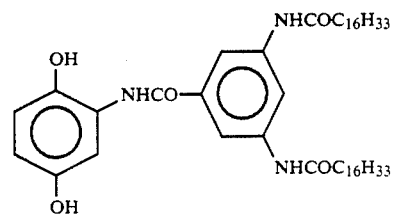

(3)

-continued
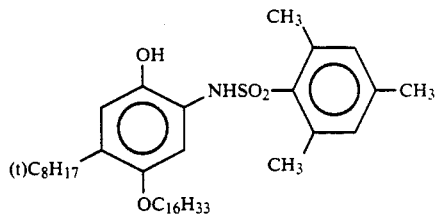 (4)
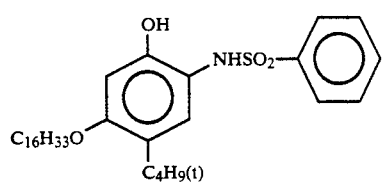 (5)
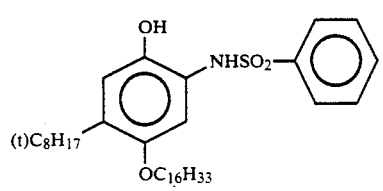 (6)
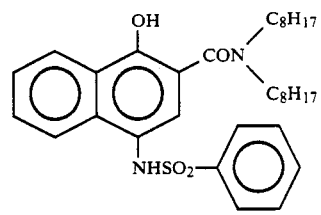 (7)
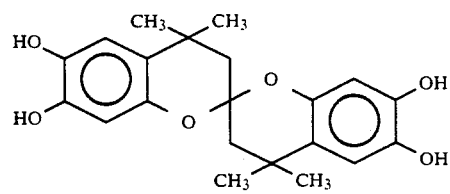 (8)
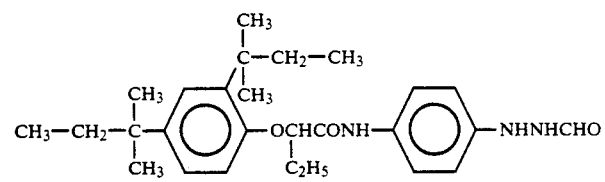 (9)
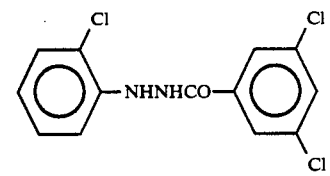 (10)
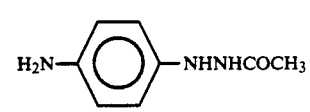 (11)
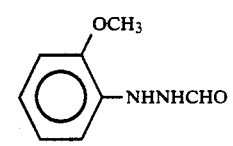 (12)

The reducing agent can be used in the light-sensitive material in an amount of wide range. The amount of the reducing agent is generally in the range of 0.1 to 1,500 mole preferably in the range of 10 to 300 mole %, based on the amount of the silver salt.

There is no specific limitation on the polymerizable compound employable in the invention. Therefore, any known polymerizable compounds having an ethylenically unsaturated group can be employed. If a heat development process is expected in the use of a light-sensitive material of the first embodiment, it is preferred to use a compound having a high boiling point (e.g., 80° C. or higher) that hardly evaporates upon heating. The pigment particles are fixed by the polymerization reaction of the polymerizable compound, so that the polymerizable compound preferably is a cross-linkable compound having plural ethylenically unsaturated groups in the molecule.

The compounds having an ethylenic unsaturated group include acrylic acids, salts of acrylic acids, acrylic esters, acrylamides, methacrylic acid, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyl acrylate, nonylphenyloxyethyl acrylate, 1,3-dioxolan acrylate, hexanediol diacrylate, butanediol diacrylate, neopentylglycol diacrylate, tricyclodecandimethylol diacrylate, trimethylolpropane triacrylate, pentaerythritol tetraacrylate, dipentaerythritol pentaacrylate, dipentaerythritol hexacrylate, diacrylate of polyoxyethylenated bisphenol A, 2 (2-hydroxy-1,1-dimethylethyl)-5-hydroxymethyl-5-ethyl-1,3-dioxane diacrylate, 2-(2-hydroxy-1,1-dimethylethyl) 5,5-dihydroxymethyl-1,3-dioxane triacrylate, triacrylate of propyleneoxide addition product of trimethylolpropane, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentylglycol dimethacrylate, trimethylolpropane trimethacrylate , pentaerythritol trimethacrylate, pentaerythritol tetramethacrylate, and dimethacrylate of polyoxyalkylenated bisphenol A.

The polymerizable compounds can be used singly or in combination of two or more compounds. Further, compounds in which a polymerizable functional group such as a vinyl group or a vinylidene group is introduced into a chemical structure of the reducing agent used in the first embodiment can be also employed as the polymerizable compound. The polymerizable compound can be preferably used in the light-sensitive material in an amount of 5 to 120,000 weight parts, more preferably 12 to 12,000 weight parts, based on one weight part of the silver halide.

An organic silver salt, a radical generator, a base and a base precursor, which can be optionally used for the light-sensitive material of the first embodiment, are described below.

In the present invention, an organic metallic salt can be used as an oxidizing agent in combination with the light-sensitive silver halide. An organic silver salt is most preferably employed.

Examples of organic compounds employable for forming such organic silver salt oxidizing agents are benztriazoles, aliphatic acids and other compounds described in U.S. Pat. No. 4,500,626 (pp. 52-53). Also effectively employable are silver salts of carboxylic acids having alkynyl group (e.g., silver phenylpropionate) and acetylene silver salt. The organic silver salts can be used in combination or two or more kinds.

The organic silver salt is generally used in an amount of from 0.01 to 10 mole(s), preferably from 0.01 to 1 mole, per 1 mole of the light-sensitive silver halide.

A radical generator which takes part in the polymerization acceleration by the aforementioned reducing agent may be contained in the light-sensitive layer of the second embodiment. Triazenesilver, silver diazotate and an azo compound are preferably used as the radical generator.

The light-sensitive material of the first embodiment may further contain a base or a base precursor as a color image formation accelerator.

As the base and the base precursor employable in the light-sensitive material of the invention, there can be mentioned inorganic or organic bases and their base precursors (e.g., decarboxylation type, thermal decomposition type, reaction type and complex salt-formation type).

Preferred examples of the base precursors include salts of organic acids and bases which decarboxylate under heating; and compounds releasing bases under heating.

The base precursor employable in the invention preferably releases a base at a temperature ranging from 50° to 200° C., more preferably from 80° to 180° C.

A process for releasing a base through a reaction between two compounds and a process for releasing a base through electrolysis are also employed as an base forming reaction.

The base or the base precursor can be used in the light-sensitive material in an amount of wide range. The amount of the base precursor is generally not more than 100% by weight, preferably in the range of 0.1 to 40% by weight, in terms of the weight of the coated light-sensitive layer. In the invention, the base and/or the base precursor can be used singly or in combination of two or more kinds.

In the case of using a base or a base precursor in the light-sensitive material, the base of the base precursor may be arranged outside of the microcapsules.

The base or the base precursor may be contained in the microcapsules. The base precursor can be introduced into the microcapsules by directly dispersing the solid base precursor in the polymerizable compound, or emulsifying an aqueous dispersion of the base precursor in the polymerizable compound.

Examples of the bases and the base precursors are given below, but these examples by no means restrict bases and base precursors employable in the invention.

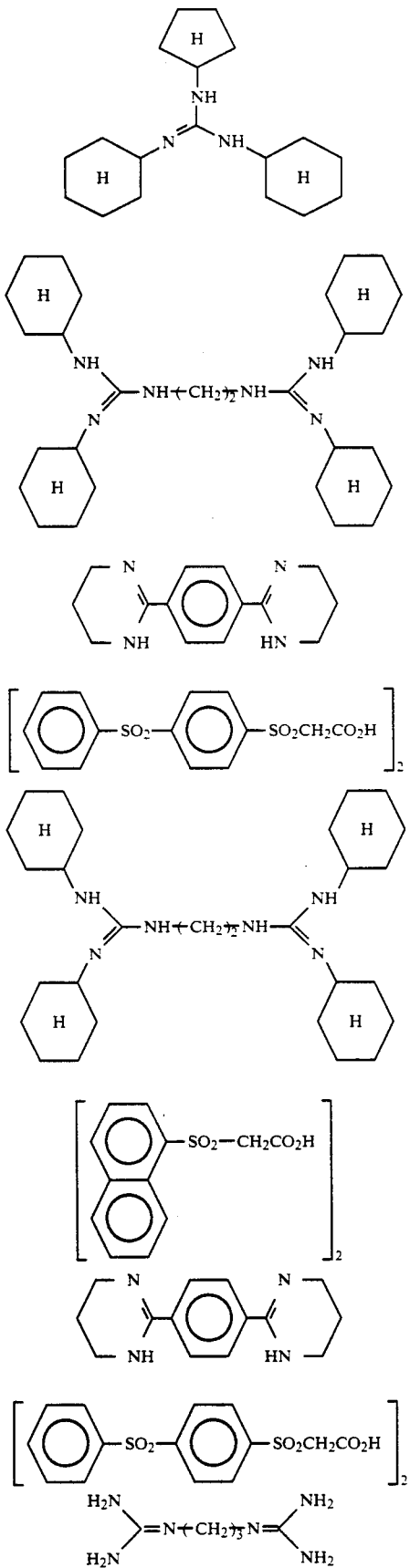
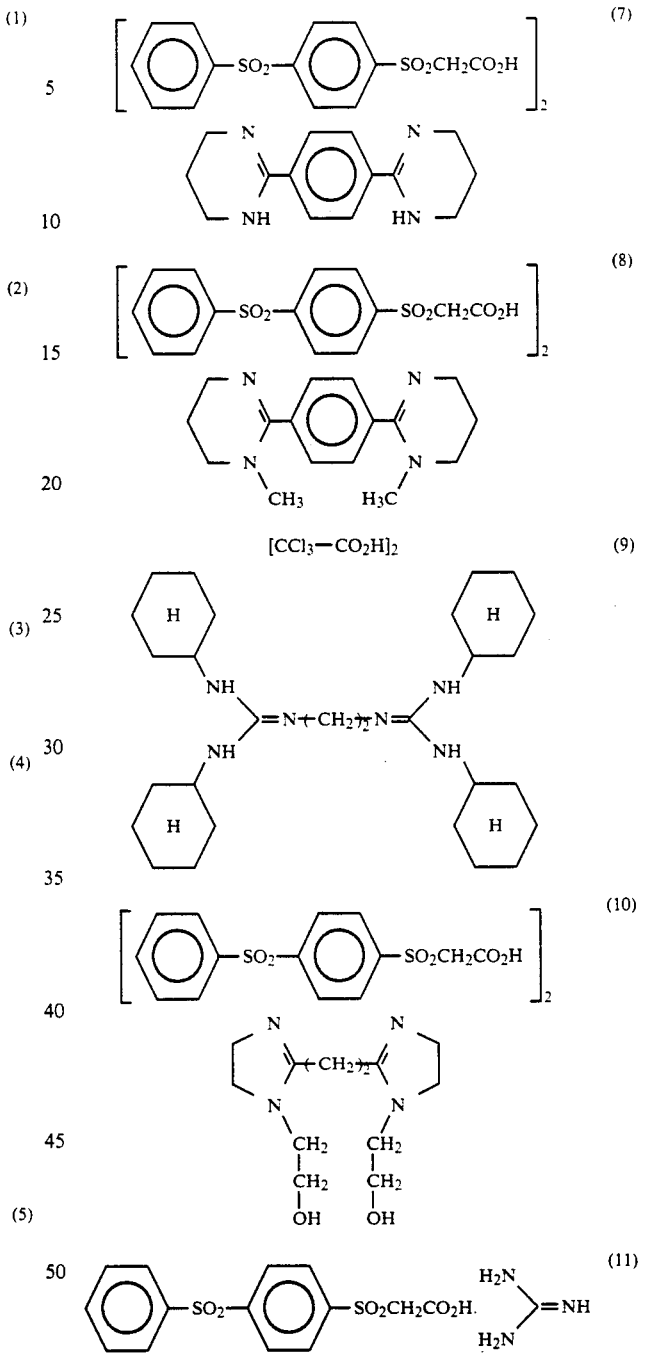

Next, the main components of the second embodiment such as the photopolymerization initiator are described below in detail.

Examples of the photopolymerization initiators include α-alkoxyphenyl ketones, polycyclic quinones, benzophenones and substituted benzophenones, xanthones, thioxanthones, halogenated compounds (e.g., chlorosulfonyl and chloromethyl polycyclic aromatic compounds, chlorosulfonyl and chloromethyl heterocyclic compounds, chlorosulfonyl and chloromethyl benzophenones, and chlorosulfonyl and chloromethyl fluorenones), haloalkanes, α-halo-α-phenylacetophenones, photo-reducing dye reducing redox couples, halogenated paraffins (e.g., brominated or chlorinated paraffin), benzoalkyl ethers, rofindimer-mercapto compound couples and organic boron compound anionic salts of organic cationic compounds.

Preferred examples of the photopolymerization initiators include benzoisobutyl, 2,2-dimethoxy-2-phenylacetophenone, 9,10-anthraquinone, benzophenone, Michler's ketone, 4,4'-diethylaminobenzophenone, xanthone, chloroxanthone, thioxanthone, chlorothioxanthone, 2,4-diethylthioxanthone, chlorosulfonylthioxanthone, chlorosulfonylanthraquinone, chloromethylanthraquinone, chloromethylbenzothiazole, chlorosulfonylbenzoxazole, chloromethylquinoline, chloromethylbenzophenone, chlorosulfonylbenzophenone, fluorenone, carbon tetrabromide, benzoisobutylether, benzoynisopropylether, and combination of 2,2'-bis(o-chlorophenyl)-4,4',5,5'-tetraphenylbiimidazole and 2-mercapto-5-methylthio-1,3,4-thiadiazole.

As the photopolymerization initiator, the above-mentioned compounds can be used singly or in combination of two or more kinds.

In the light-sensitive material of the invention, the photopolymerization initiator is preferably employed in an amount of 0.5 to 30% by weight, more preferably 2 to 20% by weight, based on the amount of the used polymerizable compound.

The polymerizable compounds employable in the light-sensitive material of the second embodiment are the same as those for the light-sensitive material of the first embodiment.

A sensitizing agent which is optionally employed in the light-sensitive material of the second embodiment is described below.

Preferred sensitizing agents serve to increase a sensitivity when used in combination with the aforementioned photopolymerization initiator or a photopolymerization initiating system. Examples of such sensitizing agents are compounds having an active hydrogen in the molecule such as N-phenylglycine, trimethyl barbituric acid, 2-mercaptobenzoxazole, 2-mercaptobenzothiazole, 2-mercaptobenzimidazole and compounds having the formula (I) or the formula (II).

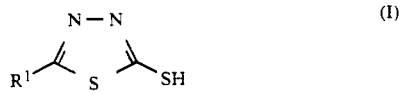

in which $R^1$ is an alkyl group, an alkylthio group or a mercapto group.

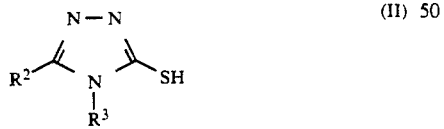

in which $R^2$ is hydrogen or an alkyl group, and $R^3$ is an alkyl group or an aryl group.

In the image formation using the light-sensitive microcapsule of the invention, the sensitizing agent is used in an amount of 0.5 to 100% by weight, more preferably 2 to 80% by weight, based on the amount of the polymerizable compound.

The silver halide, the polymerizable compound and the pigment particles (and optionally the reducing agent) are contained in the microcapsules of the first embodiment. The photopolymerization initiator, the polymerizable compound and the pigment particles are contained in the microcapsules of the second embodiment. The light-sensitive material comprises a support and a light-sensitive layer containing the microcapsules. The optionally employable components may be arranged inside or outside of the microcapsules dispersed in the light-sensitive layer.

The microcapsules, optionally employable components and a support are described below.

There is no specific limitation on the preparation of microcapsules, and any known processes can be employed. Examples of the processes for preparing microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Patent No. 990,443, and Japanese Patent Publications No. 38(1963)-19574, No. 42(1967)-446 and No. 42(1967)-771; a process utilizing precipitation of polymers as described in U.S. Pat. Nos. 3,418,250 and 3,660,304; a process of using isocyanate polyol wall-materials as described in U.S. Pat. No. 3,796,669; a process of using isocyanate wall-materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using wall-forming materials such as melamine-formaldehyde resins and hydroxypropyl cellulose as described in U.S. Pat. No. 4,025,455; an in situ process utilizing polymerization of monomers as described in Japanese Patent Publication No. 36(1961)-9168 and Japanese Patent Provisional Publication No. 51(1976)-9079; a polymerization dispersing and cooling process as described in U.K. Patents No. 927,807 and No. 965,074; and a spray-drying process as described in U.S. Pat. No. 3,111,407 and U.K. Patent No. 930,422. A process for encapsulating oily droplets of the polymerizable compound is not limited to the above-mentioned ones, but a process of emulsifying core materials and then forming a polymeric membrane as a microcapsule shell over the core material is particularly preferred.

Examples of the shell material of the microcapsules include a polyamide resin and/or a polyester resin, a polyurea resin and/or a polyurethane resin, an amino-aldehyde resin, a gelatin, an epoxy resin, a complex resin containing a polyamide resin and a polyurea resin, and a complex resin containing a polyurethane resin and a polyester resin.

In the light-sensitive material of the first embodiment, the silver halide is preferably arranged in the shell of the microcapsule. The microcapsule is preferably prepared by forming a polymer shell of a polymeric compound around a film composed of a reaction product of a water-soluble polymer having a sulfinyl group and a polymerizable compound having an ethylenic unsaturated group.

There is no specific limitation with respect to the support employable in the invention. In the first embodiment, it is preferred to use materials which are resistant to temperatures given in the developing stage.

Examples of the materials employable for the preparation of the support include glasses, ordinary papers, fine paper, coat paper, cast-coat paper, synthetic papers, metals and analogues thereof, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

In the image formation using the light-sensitive microcapsule of the present invention, an image is generally formed on an image-receiving material. The image-receiving material is described below.

Examples of support materials employable for the image-receiving material include glasses, ordinary papers, fine paper, coat paper, cast-coat paper, baryta paper, synthetic papers, metals and analogues thereof, various films made of polyester, acetyl cellulose, cellulose ester, polyvinyl acetal, polystyrene, polycarbonate and polyethylene terephthalate, and papers laminated with resin or polymer (e.g., polyethylene).

According to the present invention, a colored pigment is mainly used as a color image-forming substance, so that there is no need of incorporating a developer into the image-receiving material. Therefore, the support itself can be used as the image-receiving material. However, an image-receiving layer may be provided on the support to increase the density of the transferred image or to increase whiteness index of the image-receiving material.

Examples of components which can be optionally added to the image-receiving layer include a binder, a thermoplastic compound, a photopolymerization initiator (or a thermal polymerization initiator), a dye (or a pigment), a white pigment and an oil-absorbing agent. Those components are described below.

As the binder, a water-soluble binder is generally employed. A polymer having a low transmission coefficient of oxygen can be also used as the binder.

A thermoplastic compound may be contained in the image-receiving layer. In the case that the thermoplastic compound is contained in the image-receiving layer, the image-receiving layer itself is preferably composed of an agglomerate of fine particles of the thermoplastic compound (i.e., granular thermoplastic compound). The image-receiving layer having the above constitute has such advantages that the formation of a transferred image can be readily done and a glossy image can be obtained under heating after the image formation. There is no specific limitation on the thermoplastic compounds, and any known thermoplastic resins (plastics) and waxes can be employed. The glass transition point of the thermoplastic resin or the melting point of the wax preferably is not higher than 200° C.

A white pigment can be contained in the image-receiving layer as an oil-absorbing agent to increase a density of the transferred pigment particles in the transferring stage under pressure.

There is no specific limitation on the white pigment, and any known inorganic or organic pigments can be employed. Preferred are inorganic pigments such as silicon dioxide, titanium dioxide, zinc oxide, barium sulfate, calcium carbonate, aluminium silicate, calcium silicate and zirconium oxide. These pigments are preferably subjected to surface treatment to be bulky. Also preferred are those having various crystalline systems.

The white pigment preferably has a particle diameter of 0.1 to 50 μm, more preferably 0.5 to 10 μm. The white pigment is preferably contained in the image-receiving layer in an amount of 0.5 to 50 g/m², more preferably 1 to 20 g/m².

A photopolymerization initiator or a thermal polymerization initiator may be contained in the image-receiving layer. In the image forming method using an image-receiving material, a color image-forming substance (pigment particles) is transferred together with the unpolymerized polymerizable compound, so that the photopolymerization initiator or the thermal polymerization initiator can be incorporated into the image-receiving layer for the purpose of smoothly performing the curing procedure (fixing procedure) of the unpolymerized polymerizable compound.

A dye or a pigment may be contained in the image-receiving layer for the purpose of entering letters, symbols, frames, in the image-receiving layer, or giving a certain color to the background of the image. Further, the dye or pigment can be also employed for the purpose of making it easy to distinguish the front and back surfaces of the image-receiving material. As the dye or the pigment, there can be used various known dyes or pigments such as those employable for the conventional image formation. However, in the case that the dye or the pigment may disturb the resulting image formed on the image-receiving layer, it is preferred to make the density of the dye or the pigment lower (e.g., reflection density of not higher than 1), or to use a dye or a pigment having a property of being decolored when it is heated or irradiated with light.

In the case that a white pigment such as titanium oxide or barium sulfate is contained in the image-receiving layer, the image-receiving layer can serve as a white reflection layer. In this case, the white pigment is preferably used in an amount of 10 to 100 g per 1 g of the used thermoplastic compound.

The above-mentioned dye or pigment can be either uniformly or locally contained in the image-receiving layer. For example, if the support is composed of a material having light transmission properties and the image-receiving layer locally contains the white pigment, a part of a reflection image can be made a projected image. In other words, image information which is unnecessary for the projected image can be also recorded as a reflection image on the image receiving layer containing the white pigment.

The image-receiving layer can be composed of two or more layers depending on the above-mentioned functions. The thickness of the image-receiving layer preferably ranges from 5 to 500 μm, more preferably from 10 to 200 μm.

A protective layer may be further provided on the image-receiving layer. A layer composed of an agglomerate of granular thermoplastic compound can be also provided on the image-receiving layer.

After an image is formed on the image-receiving material by the above process, the image-receiving material can be heated to polymerize the unpolymerized polymerizable compound having been transferred onto the image-receiving material. Through this heating process, the obtained image can be improved in the preservability.

Use of the light-sensitive material is described hereinafter.

First, use of the light-sensitive material of the first embodiment is described below.

In the use of the light-sensitive material of the first embodiment, the light-sensitive material is subjected to development process simultaneously with or after imagewise exposure.

Various exposure means can be employed in the image-wise exposure, and in general, the light-sensitive material is imagewise exposed to a radiation including visible light to obtain a latent image of the silver halide. The kind of light source or the amount of light employed in the exposure can be selected depending on a light-sensitive wavelength (or intensified wavelength in the case of spectral sensitization) of the silver halide and a sensitivity of the light-sensitive material. An original image can be either monochromatic image or color image.

Development of the light-sensitive material can be conducted simultaneously with or after the imagewise exposure.

In the image-forming method according to the invention, the light-sensitive material is developed by a heat development process.

Heating in the heat development process can be conducted in various known manners. For example, the light-sensitive material may be heated by contacting the light-sensitive material or the image-receiving material with a heated plate (e.g., hot plate) or a drum or transferring it by means of a heat roller.

Otherwise, the light-sensitive material may be heated using an air heated to a high temperature or using a high frequency or a laser beam. Infrared heating can be also employed depending on the nature of the light-sensitive material having a polymer image formed thereon. Further, a heating process utilizing extra electric current generating through magnetic induction can be also employed.

Moreover, the light-sensitive material having a polymer image formed thereon may be heated in a bath containing a heated inert liquid (e.g., fluorine atom-containing liquid). A heating layer which is arranged on the light-sensitive material can be used as the heating means. The heat development process may be conducted under suppressing the amount of oxygen existing in the light-sensitive layer. The temperature for the heat development process usually ranges from 50° C. to 200° C., preferably from 60° C. to 150° C. The heating time is usually not shorter than 1 second, preferably from 1 second to 5 minutes, more preferably from 1 second to 1 minute.

The development process may be conducted by heating at a temperature of not lower than 50° C. under the condition that the light-sensitive layer contains a liquid in an amount of 10 to 400 wt. % based on the amount of the polymerizable compound.

The development process can be carried out with or after adding the above-mentioned base or base precursor to the light-sensitive layer instead of incorporating the base or the base precursor into the light-sensitive material. For adding the base or the base precursor to the light-sensitive layer, a method of using a sheet containing the base or the base precursor (i.e., base sheet) is most easy and preferred.

The light-sensitive material is subjected to the above-mentioned heat development process to polymerize the polymerizable compound within the area where a latent image of the silver halide has been formed or the area where a latent image of the silver halide has not been formed. In the heat development process, generally, the polymerizable compound is polymerized within the area where a latent image of the silver halide has been formed. However, the polymerizable compound within the area where a latent image of the silver halide has not been formed can be polymerized by adjusting the kind or the amount of the reducing agent.

A polymer image obtained on the light-sensitive material as above is transferred onto the image-receiving material by pressing the light-sensitive material superposed on the image-receiving material.

Next, use of the light-sensitive material of the second embodiment is described below.

As an exposure means of the light-sensitive material, there can be employed various exposure means. Examples of the light sources generally used include sun light, stroboscopic light, flash light, tungsten lamp, mercury lamp, halogen lamp (e.g., iodine lamp), xenon lamp and laser light sources. Further, CRT light source, plasma light source, fluorescent tube and light emission diode can be employed. Also employable is an exposure means in which a microshutter array using LCD (liquid crystal) or PLZT (lead titanium zirconate doped with lanthanum) is combined with linear light source or plane-like light source.

In the image formation, the light-sensitive material having a polymer image formed thereon and the image-receiving material are pressed at a pressure of higher than 500 kg/cm$^2$ to transfer the core material onto the image-receiving material.

For applying a pressure to the light-sensitive material and the image-receiving material, any known pressing methods can be employed.

For example, the light-sensitive material and the image-receiving material are sandwiched between press plates such as a presser or transferred using a pressure roller such as a nip roll, to apply a pressure to them. A dot-impact device can be also employed to intermittently give a pressure to them. Otherwise, a pressure may be applied to the light-sensitive material and the image-receiving material by spraying a high-pressure air by means of an air gun or using a ultrasonic wave-generating device or a piezo-electric element.

The pressure for pressing the light-sensitive material and the image-receiving material preferably is higher than 500 kg/cm$^2$, more preferably higher than 700 kg/cm$^2$.

After an image is formed on the image-receiving material by the above process, the image-receiving material can be heated to polymerize the unpolymerized polymerizable compound having been transferred onto the image-receiving material. Through this heating process, the obtained image can be improved in the preservability.

The light-sensitive material of the invention can be used for monochromatic or color photography, printing, radiography, medical diagnosis (e.g., CRT photography of diagnostic device using ultrasonic wave) and copy (e.g., computer-graphic hard copy).

The present invention is further described by the following examples, but those examples are given by no means to restrict the invention.

EXAMPLE 1

Preparation of silver halide emulsion (A)

In 1,600 ml of water were dissolved 20 g of gelatin and 0.5 g of sodium chloride, and the resulting gelatin solution was adjusted to pH 3.5 using 1N-sulfuric acid and was kept at 45° C. To the gelatin solution, 200 ml of an aqueous solution containing 71 g of potassium bromide and 200 ml of an aqueous solution containing 0.59 mole of silver nitrate were added simultaneously at the same feed rate over 30 minutes. After 1 minute, to the resulting mixture was added 48 ml of 0.5% methanol solution of the following sensitizing dye (1), and after 15 minutes, to the resulting mixture were further added 100 ml of an aqueous solution containing 3.65 g of potassium iodide and 100 ml of an aqueous solution containing 0.022 g of silver nitrate at the same feed rate over 5 minutes. To the resulting emulsion was then added 1.2 g of polyisobutylene/monosodium maleate copolymer. After the emulsion was washed with water for desalting, 10 g of gelatin was added to the emulsion. Then, to the emulsion was further added 0.45 mg of sodium thiosulfate to chemically sensitize the emulsion at 55° C. for 20 minutes. Thus, a silver halide emulsion (A) (tetradecahedral silver iodobromide monodispersed emulsion, yield: 1,000 g) having a mean grain size of 0.13 μm was prepared.

(Sensitizing dye (1))

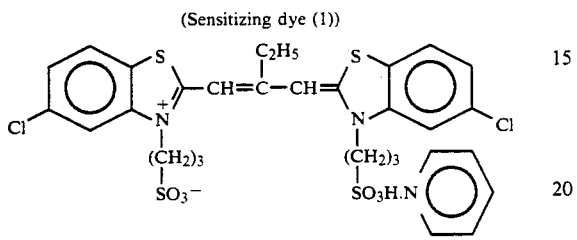

Preparation of colored polymerizable composition (A)

To 270 g of the following polymerizable compound (1) (Kayarad R-604 of Nippon Kayaku Co., Ltd.) was added 30 g of a copper phthalocyanine pigment coated on the surface with ethyl cellulose (Ethyl Cellulose N-14 of Hercures Co., Ltd.), and the resulting mixture was pulverized for 1 hour at 6,000 r.p.m. using Eiger motor mill (tradename of Eiger Engineering Co., Ltd.), to prepare a colored polymerizable composition (A).

(Polymerizable compound (1))

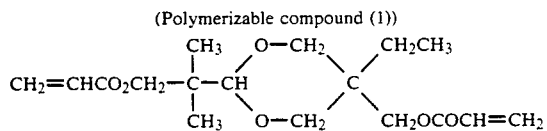

Preparation of light-sensitive composition (A)

To 54 g of the colored polymerizable composition (A) obtained above were added 4.8 g of 25% solution of the following copolymer in an ethyl acetate-isopropanol mixture solvent (ethyl acetate/isopropanol=1/1), 3.5 g of the following reducing agent (I), 3.0 g of the following reducing agent (II), 0.01 g of the following mercapto compound, 0.05 g of the following mercapto compound derivative, 1.2 g of a surface active agent (tradename: Emulex NP-8, available from Nippon Emulsion Co., Ltd.) and 20 g of methylene chloride, to prepare a homogeneous oily solution.

(Copolymer)

$$-(CH_2-C(CH_3))_{20}- \quad -(CH_2-C(CH_3))_{80}-$$
$$CO_2CH_2CH_2OH \quad CO_2C_2H_5$$

(Reducing agent (I))

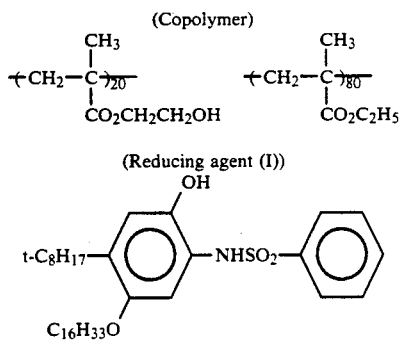

-continued
(Reducing agent (II))

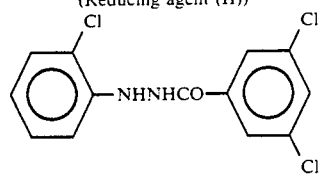

(Mercapto compound)

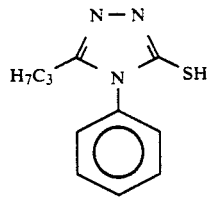

(Mercapto compound derivative)

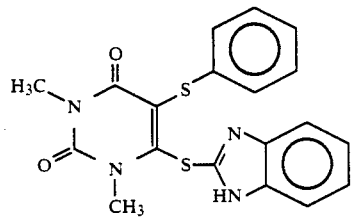

To 3 g of the above-obtained silver halide emulsion (A) were added 0.9 g of 10% aqueous solution of potassium bromide and 0.6 g of 1% aqueous solution of polyvinyl pyrrolidone to prepare an aqueous solution. To the aqueous solution was added the above-obtained oily solution, and the resulting mixture was stirred at 15,000 r.p.m. for 5 minutes using a homogenizer to obtain a light-sensitive composition (A) in the form of a W/O emulsion.

Preparation of light-sensitive microcapsule (A)

To the above-obtained light-sensitive composition (A) was added 2.7 g of a polyisocyanate compound (Takenate D. 110N of Takeda Chemical Industries, Ltd.), and they were well mixed. To the resulting mixture was added 126 g of a 10% aqueous solution of partial sodium polyvinylbenzenesulfonate (VERSA TL-502 of National Starch Co., Ltd.) having been adjusted to pH 6.0 using 10% aqueous solution of sodium hydroxide, and the resulting mixture was stirred at 9,000 r.p.m. for 30 minutes at 40° C. using a homogenizer to obtain a W/O/W emulsion.

Independently, to 13.2 g of melamine were added 21.6 g of 37% aqueous solution of formaldehyde and 70 g of distilled water, and the resulting mixture was stirred at 60° C. for 30 minutes to obtain a transparent melamine-formaldehyde precondensate. To 40 g of the precondensate was added the above-prepared W/O/W emulsion, and the resulting mixture was adjusted to pH 6.0 using 20% aqueous solution of phosphoric acid under stirring. The mixture was then heated to 60° C. and stirred for 120 minutes. Further, to the mixture was added 16 g of a 40% aqueous solution of urea to remove formaldehyde remaining in the microcapsule dispersion, and the mixture was adjusted to pH 3.5 using 20% aqueous solution of phosphoric acid. After the reaction was completed, the mixture was adjusted to pH 6.5 using 10% aqueous solution of sodium hydroxide, and then cooled. Thus, a light-sensitive microcapsule dispersion (A) containing microcapsules having a melamine-formaldehyde resin shell was obtained.

Preparation of light-sensitive material (A)

To 30 g of the above-obtained light-sensitive microcapsule dispersion (A) were added 0.2 g of a surface active agent (Emulex NP-8 of Nippon Emulsion Co., Ltd.), 15 g of 10% solution of guanidine trichloroacetate (water/ethanol =1/1) and water, to prepare 74 g of a coating solution for the formation of a light-sensitive layer.

The coating solution was coated over a polyethylene terephthalate film (thickness: 100 μm) in an amount of 57 g/m², and the coated layer of the solution was dried at approx. 50° C. for 1 hour to prepare a light-sensitive material (A).

Preparation of image-receiving material

To 160 g of water was added 11 g of a 40% aqueous solutionof sodium hexametaphosphate, and to the mixture was further added 82 g of a 55% slurry of calcium carbonate, followed by coarsely dispersing in a mixer. The resulting coarse dispersion was then finely dispersed in Dynomill dispersing device. To 200 g of the resulting dispersion were added 6 g of a 50% latex of SBR and 55 g of an 8% aqueous solution of polyvinyl alcohol, and the resulting mixture was made uniform to give a coating solution for the formation of an image-receiving layer.

The coating solution was evenly coated on an art paper having a basis weight of 43 g/m² to give a coated layer of the solution having a wet thickness of 30 μm, and the coated layer was dried to prepare an image-receiving material.

Image formation and evaluation thereof

Using the above-obtained light-sensitive material (A) and image-receiving material, the following image-forming method was performed and evaluated.

The light-sensitive material (A) was imagewise exposed to light at 5,000 lux for 1 second using a tungsten lamp over a continuous filter having a transmission density of 0 -3.0, and then heated on a hot plate at 130° C. for 10 seconds. Thereafter, the light-sensitive material (A) was superposed on the image-receiving material in such a manner that the light-sensitive layer faced the image-receiving layer, and they were passed through a pressure roller having a pressure of 500 kg/cm². Then the light-sensitive material (A) was separated from the image-receiving material. Thus, a transferred image of high sharpness having a maximum density of the unexposed portion of 1.27 was obtained on the image-receiving material. As a result of observation using a microscope, any agglomeration of pigment particles was not found in the obtained microcapsules.

EXAMPLE 2

The procedure for preparing the colored polymerizable composition (A) in Example 1 was repeated except for using a copper phthalocyanine pigment having been coated on the surface with ethyl cellulose (Ethyl Cellulose N-50 of Hercures Co., Ltd.) instead of the ethyl cellulose (Ethyl Cellulose N-14 of Hercures Co., Ltd.), to prepare a colored polymerizable composition (B).

Then, light-sensitive microcapsules were prepared in the same manner as described in Example 1 except that the colored polymerizable composition (B) was used instead of the composition (A), and using the obtained light-sensitive microcapsules, a light-sensitive material (B) was prepared in the same manner as described in Example 1.

The light-sensitive material (B) was subjected to the development process and the pressure-transference process under the same conditions as described in Example 1, to obtain a sharp image having a maximum density of 1.24 on the image-receiving material. As a result of observation using a microscope, any agglomeration of pigment particles was not found in the obtained microcapsules.

EXAMPLE 3

With 270 g of the following polymerizable compound (2) was mixed 30 g of a red pigment (Pigment Red 144, Cromphtal Red BR produced by Ciba Geigy) having been coated on the surface with a vinyl copolymer, and the mixture was dispersed under the same condition as that for the colored polymerizable composition (A) in Example 1, to prepare a colored polymerizable composition (C).

Then, light-sensitive microcapsules were prepared in the same manner as described in Example 1 except that the colored polymerizable composition (C) was used instead of the composition (A), and using the obtained light-sensitive microcapsules, a light-sensitive material (C) was prepared in the same manner as described in Example 1.

The light-sensitive material (C) was subjected to the development process and the pressure-transference process under the same conditions as described in Example 1, to obtain a sharp image having a maximum density of 1.0 on the image-receiving material As a result of observation using a microscope, any agglomeration of pigment particles was not found in the obtained microcapsules.

(Polymerizable compound (2))

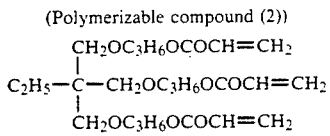

EXAMPLE 4

Preparation of light-sensitive material (X)

To 54 g of the colored polymerizable composition (C) obtained in Example 3 was added 3.8 g of the following photopolymerization initiator (Irgacure 651 of Ciba Geigy), to prepare a light-sensitive composition (X).

(Photopolymerization initiator)

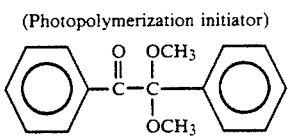

Preparation of light-sensitive microcapsule (X)

The procedure for preparing the light-sensitive microcapsule dispersion (A) in Example 1 was repeated except for using the light-sensitive composition (X) instead of the light-sensitive composition (A), to prepare a light-sensitive microcapsule dispersion (X).

Preparation of light-sensitive material (X)

The procedure for preparing the light-sensitive material (A) in Example 1 was repeated except for using the light-sensitive microcapsule dispersion (X) instead of the light-sensitive microcapsule dispersion (A) and not using the trichloroacetate solution of guanidine, to prepare a light-sensitive material (X).

Image formation and evaluation thereof

The light-sensitive material (X) was brought into close contact with a filter having a density of 0.15, and exposed to light for 40 seconds using a mercury lamp of 1 kw at a distance of 50 cm. Then, the light-sensitive material (X) was superposed on the image-receiving material in such a manner that the light-sensitive layer faced the image-receiving layer, and they were passed through a pressure roller having a pressure of 500 kg/cm$^2$. Then the light-sensitive material (X) was separated from the image-receiving material. Thus, a sharp image was obtained on the image-receiving material. The density (maximum density) of the image measured using Macbeth reflection densitometer was 1.08. As a result of observation using a microscope, any agglomeration of pigment particles was not found in the obtained microcapsules.

COMPARISON EXAMPLE 1

With 270 g of the polymerizable compound (1) was mixed 30 g of a copper phthalocyanine pigment having been subjected to no surface treatment, and the mixture was dispersed using Eiger motor mill under the same condition as that for the colored polymerizable composition (A), to prepare a colored polymerizable composition (D).

Then, light-sensitive microcapsules were prepared in the same manner as described in Example 1 except that the colored polymerizable composition (D) was used instead of the composition (A), and using the obtained light-sensitive microcapsules, a light-sensitive material (D) was prepared in the same manner as described in Example 1.

In this case, the above-obtained colored polymerizable composition (D) was unstable, and the pigment particles contained therein agglomerated with time. Further, as a result of observation of the obtained microcapsules, the microcapsules had nonuniform shapes and the shells of the microcapsules were insufficiently formed. Therefore, the surface of the coated layer of the microcapsule dispersion was in bad condition and was sticky. The light-sensitive material (D) was subjected to the same evaluation as that in Example 1, but a sharp image was not obtained on the image-receiving material.

COMPARISON EXAMPLE 2

With 270 g of the polymerizable compound (2) was mixed 30 g of a red pigment (Pigment Red 144) having been subjected to no surface treatment, and the mixture was dispersed using Eiger motor mill under the same condition as that for the colored polymerizable composition (A), to prepare a colored polymerizable composition (E).

Then, light-sensitive microcapsules were prepared in the same manner as described in Example 1 except that the colored polymerizable composition (E) was used instead of the composition (A), and using the obtained light-sensitive microcapsules, a light-sensitive material (E) was prepared in the same manner as described in Example 1.

In this case, the pigment particles contained in the colored polymerizable composition (D) were relatively large, and they agglomerated with time. Further, as a result of the observation of the obtained microcapsules, coalescence of the microcapsules was markedly found. Moreover, the surface of the coated layer of the microcapsule dispersion was in bad condition, and the density of the transferred image on the image-receiving material was not more than 0.8. That is, it seemed that the formation of the microcapsule shell was inhibited.

As is evident from the examples and the comparison examples, when a pigment as a color image-forming substance is surface-treated with a polymer to be lipophilic, the pigment can be improved in the dispersing stability (i.e., dispersibility) in a polymerizable compound, and thereby light-sensitive microcapsules having shells of high denseness and free from coalescence can be obtained.

EXAMPLE 5

Preparation of silver halide emulsion (ER-1)

In 1,600 ml of water were dissolved 20 g of gelatin and 0.8 g of sodium chloride, and the resulting gelatin solution was adjusted to pH 3.4 using 1N-sulfuric acid and was kept at 45° C. To the gelatin solution, 200 ml of an aqueous solution containing 65 g of potassium bromide and 200 ml of an aqueous solution containing 100 g of silver nitrate were added simultaneously at the same feed rate over 30 minutes. After 1 minute, to the resulting mixture was added the sensitizing dye (1) used in Example 1, and after 15 minutes, to the resulting mixture were further added 100 ml of an aqueous solution containing 2.00 g of potassium iodide and 100 ml of an aqueous solution containing 0.022 g of silver nitrate at the same feed rate over 5 minutes. To the resulting emulsion was then added 1.2 g of polyisobutylene-/monosodium maleate copolymer for sedimentation. After the emulsion was washed with water for desalting, 3.5 g of gelatin was dissolved in the emulsion. Then, to the emulsion was further added 0.45 mg of sodium thiosulfate to chemically sensitize the emulsion at 55° C. for 20 minutes. Thus, a silver halide emulsion (ER-1) (tetradecahedral silver iodobromide monodispersed emulsion, yield: 440 g) having a mean grain size of 0.13 μm was prepared.

Preparation of solid dispersion (KB-1)

In a 300 ml-dispersing container were placed 160 g of 3% aqueous solution of gelatin, 40 g of the following base precursor (BG-1) and 200 ml of glass beads having a diameter in the range of 0.5 to 0.75 mm. The mixture was stirred at 3,000 r.p.m. for 30 minutes using a Dynomill dispersing device to obtain a solid dispersion (KB-1) having a mean particle size of not larger than 1.0 μm.

(Base precursor (BG-1))

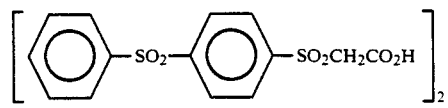

-continued

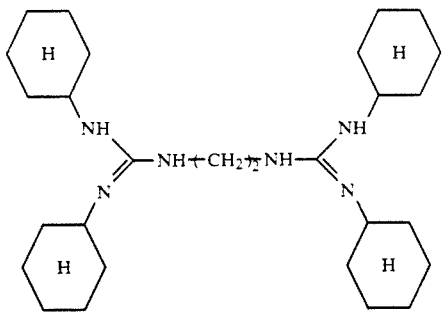

Preparation of polymerizable composition (GC-1)

To 300 g of the polymerizable compound (1) used in Example 1 was added 30 g of a copper phthalocyanine pigment coated on the surface with ethyl cellulose (Ethyl Cellulose N-14 of Hercures Co., Ltd.), and the resulting mixture was stirred for 1 hour at 5,000 r.p.m. using Eiger motor mill (tradename of Eiger Engineering Co., Ltd.), to prepare a colored polymerizable composition (GC-1).

Preparation of light-sensitive composition (PR-1)

In 49 g of the colored polymerizable composition (GC-1) obtained above was dissolved 10 g of 20% solution of the following copolymer (1P-1) in the following solvent (SV-1). To the solution were further dissolved, 3.29 g of the reducing agent (I) used in Example 1 and 2.4 g of the reducing agent (II) used in Example 1 to obtain an oily solution.

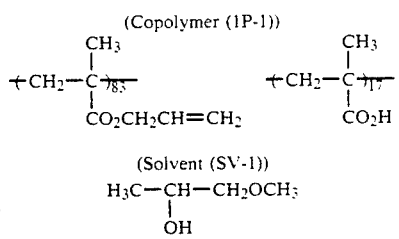

To the oily solution were added 4.5 g of the silver halide emulsion (ER-1) and 38 g of the solid dispersion (KB-1), and the resulting mixture was stirred at 15,000 r.p.m. for 5 minutes using a homogenizer to obtain a light-sensitive composition (PR-1) in the form of a W/O emulsion.

Preparation of light-sensitive microcapsule (CR-1)

A mixture of 10 g of 15% aqueous solution of potassium polyvinylbenzenesulfinate and 162 g of 7.1% aqueous solution of polyvinylpyrrolidone (K-90 produced by Wako Junyaku Co., Ltd.) was adjusted to pH 5.0. To the mixture was added the above-obtained light-sensitive composition (PR-1), and the resulting mixture was stirred at 3,000 r.p.m. for 30 minutes at 50° C. using a Dissolver to obtain a W/O/W emulsion.

Independently, to 14.8 g of melamine were added 20.0 g of 37% aqueous solution of formaldehyde and 76.3 g of distilled water, and the resulting mixture was stirred at 60° C. for 40 minutes to obtain a transparent melamine-formaldehyde precondensate.

To 70.0 g of the precondensate was added the above-prepared W/O/W emulsion, and the resulting mixture was adjusted to pH 5.0 using 10% aqueous solution of sulfuric acid. The mixture was then heated to 60° C. and stirred for 120 minutes. Further, the mixture was adjusted to pH 6.5 using 10% aqueous solution of sodium hydroxide to prepare a light-sensitive microcapsule dispersion (CR-1) containing microcapsules having a melamine-formaldehyde resin shell.

Preparation of light-sensitive material (I)

To 2.50 g of the above-obtained light-sensitive microcapsule dispersion (CR-1) were added 0.33 g of 5% aqueous solution of a surface active agent (Emulex NP-8 of Nippon Emulsion Co., Ltd.), 0.83 g of 20% aqueous dispersion of cornstarch and 3.19 g of distilled water. The resulting mixture was well stirred to prepare a coating solution.

The coating solution was coated over a polyethylene terephthalate film (thickness: 100 μm) using a wire bar of #40, and the coated layer of the solution was dried at approx. 40° C. for 1 hour to prepare a light-sensitive material (I).

Preparation of image-receiving material (B)

To 221.4 ml of water were added 80 g of calcium carbonate (PC700 produced by Shiroishi Kogyo Co., Ltd.) and 1.6 g of a surfactant (Poise 520 produced by Kao Co., Ltd.). The mixture was stirred at 2,000 r.p.m. for 20 minutes using a Polytron dispersing device (PT10/35 type produced by Cinematica Co., Ltd.). To 60 g of the resulting dispersion was added 32 g of 8% aqueous solution of polyvinyl alcohol, and to the mixture was further added 42.6 ml of water to prepare a coating solution for the formation of an image receiving layer.

The coating solution was evenly coated on a paper support having a basis weight of 55 g/m$^2$ (which has such a distribution of formation that the amount of residual pulp on 24 mesh screen and on 42 mesh screen is in the range of 30 to 60 weight % based on the total amount of the pulp contained in the base paper sheet of the paper support as is defined in JIS-P-8207) in coating amount of 110 g/m$^2$, and the coated layer was dried at 60° C. to prepare an image-receiving material (B).

Image formation and evaluation thereof

The light-sensitive material (I) was imagewise exposed to light at 2,000 lux and color temperature of 4800 k for 1 second using a tungsten lamp over a continuous filter having a transmission density of 0 3.0, and then heated on a hot plate at 140° C. for 10 seconds. Thereafter, the light-sensitive material (I) was superposed on the image-receiving material (B) in such a manner that the light-sensitive layer faced the image-receiving layer, and they were passed through a pressure roller having a pressure of 500 kg/cm$^2$. Then the light-sensitive material (I) was separated from the image-receiving material (B). Thus, a blue clear image was obtained on the image-receiving material (B).

I claim:

1. A light-sensitive microcapsule which contains silver halide, an ethylenically unsaturated polymerizable compound and pigment particles,
    wherein the pigment particles are coated with a surface-treating agent selected from the group consisting of a lipophilic resin, a lipophilic polymer, a wax and an oil-soluble surface active agent to be lipophilic.

2. The light-sensitive microcapsule as claimed in claim 1, wherein the pigment particles are coated with a lipophilic resin.

3. The light-sensitive microcapsule as claimed in claim 1, wherein the pigment particles are coated with an oil-soluble surface active agent.

4. The light-sensitive microcapsule as claimed in claim 1, wherein the pigment particles have a particle size in the range of 0.01 to 10 μm.

5. The light-sensitive microcapsule as claimed in claim 1, wherein a reducing agent is contained in the light-sensitive microcapsule.

6. The light-sensitive microcapsule as claimed in claim 1, wherein the polymerizable compound and the pigment particles are arranged in the core of the light-sensitive microcapsule, and the pigment particles are dispersed in the polymerizable compound.

7. The light-sensitive microcapsule as claimed in claim 1, wherein the polymerizable compound is contained in the light-sensitive microcapsule in an amount of 5 to 120,000 weight parts based on one weight part of the silver halide.

8. The light-sensitive microcapsule as claimed in claim 1, wherein the pigment particles are contained in the light-sensitive microcapsule in an amount of 5 to 120 weight parts based on 100 weight parts of the polymerizable compound.

9. The light-sensitive microcapsule as claimed in claim 1, wherein the pigment particles are coated with a surface treating agent, and the treating agent is used in an amount of 1 to 100 weight % based on the solid amount of the pigment particles.

* * * * *